United States Patent
Gheewala et al.

(10) Patent No.: US 6,617,621 B1
(45) Date of Patent: Sep. 9, 2003

(54) GATE ARRAY ARCHITECTURE USING ELEVATED METAL LEVELS FOR CUSTOMIZATION

(75) Inventors: Tushar R. Gheewala, Los Altos, CA (US); Duane G. Breid, Lakeville, MN (US); Deepak D. Sherlekar, Cupertino, CA (US); Michael J. Colwell, Fremont, CA (US)

(73) Assignee: Virage Logic Corporation, Fremont, CA (US)

( * ) Notice: Subject to any disclaimer, the term of this patent is extended or adjusted under 35 U.S.C. 154(b) by 0 days.

(21) Appl. No.: 09/588,802

(22) Filed: Jun. 6, 2000

(51) Int. Cl.[7] ............................................. H01L 27/10
(52) U.S. Cl. ..................... 257/207; 257/203; 257/208
(58) Field of Search ................. 257/202, 203, 257/206–208, 210, 211; 438/128

(56) References Cited

U.S. PATENT DOCUMENTS

| | | | | |
|---|---|---|---|---|
| 4,668,972 A | | 5/1987 | Sato et al. ................... 257/369 |
| 4,816,887 A | | 3/1989 | Sato ............................ 257/206 |
| 4,851,892 A | * | 7/1989 | Anderson et al. ........... 257/206 |
| 4,884,118 A | | 11/1989 | Hui et al. .................... 257/206 |
| 5,038,192 A | | 8/1991 | Bonneau et al. ............ 257/206 |
| 5,079,614 A | | 1/1992 | Khatakhotan ............... 257/369 |
| 5,289,021 A | | 2/1994 | El Gamal .................... 257/206 |
| 5,341,041 A | | 8/1994 | El Gamal ...................... 326/44 |
| 5,452,245 A | * | 9/1995 | Hickman et al. ............ 257/206 |
| 5,631,478 A | | 5/1997 | Okumura ..................... 257/211 |
| 5,635,737 A | * | 6/1997 | Yin .............................. 257/204 |
| 5,898,194 A | * | 4/1999 | Gheewala .................... 257/204 |
| 5,917,224 A | | 6/1999 | Zangara ....................... 257/390 |
| 5,923,060 A | | 7/1999 | Gheewala .................... 257/207 |
| 5,981,987 A | | 11/1999 | Brunolli et al. ............. 257/207 |
| 6,014,038 A | * | 1/2000 | How et al. ..................... 326/40 |
| 6,091,090 A | | 7/2000 | Gheewala .................... 257/211 |
| 6,177,691 B1 | * | 1/2001 | Iranmanesh et al. ........ 257/206 |
| 6,242,767 B1 | * | 6/2001 | How et al. ................... 257/202 |
| 6,307,222 B1 | | 10/2001 | Brunolli et al. ............. 257/207 |
| 6,331,733 B1 | * | 12/2001 | Or-Bach et al. ............ 257/211 |
| 6,445,065 B1 | | 9/2002 | Gheewala et al. .......... 257/691 |

* cited by examiner

*Primary Examiner*—George Eckert
(74) *Attorney, Agent, or Firm*—Townsend and Townsend and Crew LLP; Kenneth R. Allen

(57) ABSTRACT

An metal programmable integrated circuit apparatus and method of manufacture and design using elevated metal layers for design-specific customization. The lower metal layer are used to form core cells and to provide power and clocking signals to the core cells. These core cell are customizable by the designer using only the upper metal layers. This new architecture allows faster turn-around time and fewer masks while keeping the time-to-market advantages of gate array structures.

53 Claims, 19 Drawing Sheets

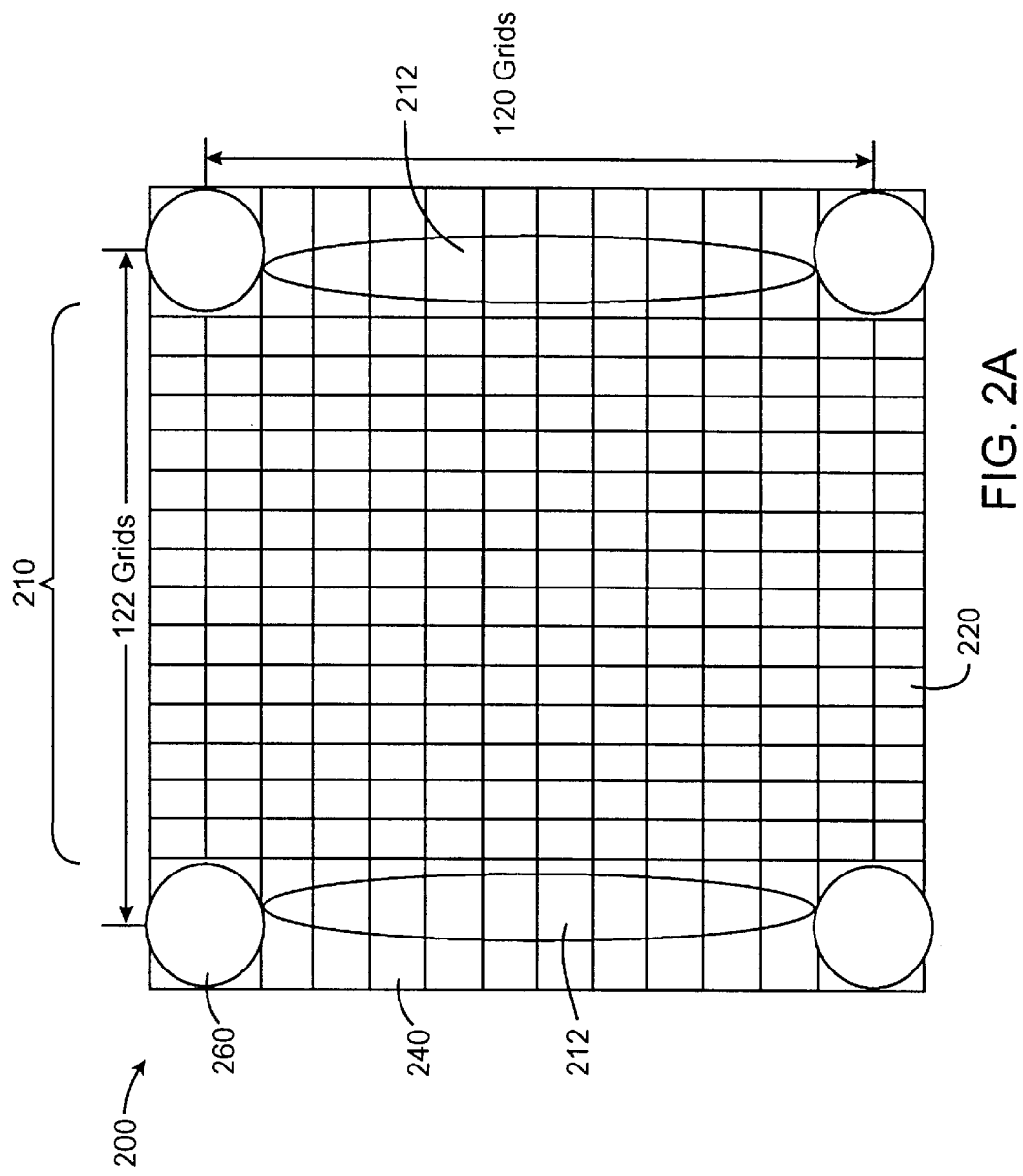

ic circuits. More specifically, it provides a new architecture, method of manufacturing and method of design for integrated circuits with multiple metal layers.

GATE ARRAY ARCHITECTURE USING ELEVATED METAL LEVELS FOR CUSTOMIZATION

CROSS REFERENCE TO RELATED APPLICATIONS

This application is related to concurrently filed and commonly assigned patent application Ser. No. 09/588,804 entitled "A ROUTING DRIVEN, METAL PROGRAMMABLE INTEGRATED CIRCUIT ARCHITECTURE WITH MULTIPLE TYPES OF CORE CELLS", having Tushar R. Gheewala and Henry H. Yang listed as co-inventors and assigned to In-Chip Systems, Inc.

BACKGROUND OF THE INVENTION

The present invention relates generally to integrated circuits. More specifically, it provides a new architecture, method of manufacturing and method of design for integrated circuits with multiple metal layers.

In today's rapidly changing environment, time to market is one of the key challenges of integrated circuit designers. Thus, methodologies and architectures have been developed over the years to speed up the time it takes to design and manufacture an integrated circuit. Two methods that have been used extensively in the past are standard cell and gate array technologies. Though these methods have provided some benefits, the benefits have come at a cost.

In standard cell technology, a physical library of commonly used functional blocks such as NAND, NOR, flip-flops, multiplexors, counters, and the like are pre-designed for use by the designer. The designer simply picks the functional blocks needed for the design and describes their interconnections. Then, the design is automatically placed and routed with software tools. This provides an improvement over full custom design in which the designer does not have a ready and pre-verified library of cells available to him. However, in the standard cell methodology, each functional block has its own unique geometries of active, gate and metal layers, so fabrication of a standard cell integrated circuit requires processing of each layer after completion of the functional design. Moreover, each layer requires a different mask to project the pattern on the silicon wafer. Lately, the cost of masks has become very high and is projected to exceed $500,000 per mask set in the near future. Hence standard cell design flow is becoming simply unacceptable to many designers in terms of both time and cost.

To solve some of these shortcomings, gate array technology became popular for faster turn-around time and reduced mask cost. Like standard cell design, gate array technology also comprises a library of predesigned and preverified logic blocks, but in gate arrays the logic blocks are built upon from the same basic unit (called a "core cell" or "basic cell") consisting of fixed active (diffusion) and gate level geometries. Different functions are created by personalizing the metal layers only. Consequently, only the metal layers need to be processed after completion of a design based on gate array technology. Many times the gate array design approach is known as a metal programmable design approach. The fabrication of a gate array thus has two phases, a pre-design phase in which the non-metal layers are fabricated ahead of design completion, and a post design phase in which the design specific metal layers are fabricated after the design is completed. This can shave several weeks off the manufacturing cycle compared with full custom or standard cell design. As the cost of manufacturing masks has increased with decreasing geometries, the lower mask cost has become a second significant benefit of gate arrays.

On the other hand, gate arrays have two distinct disadvantages in comparison with standard cell designs. First, the height of gate array cells is typically 20% to 30% larger than standard cells. This is because the gate arrays can only use metal layers to interconnect the transistors, whereas the standard cell layouts are free to use diffusion and gate electrode layers for some of the connections. This limitation is especially evident in the design of complex synchronous cells such as flip-flops. As a result, the gate array densities are significantly lower than those of standard cells, resulting in a more expensive silicon die. The second disadvantage of gate arrays is a significantly higher power dissipation that results from the fact that all transistors are generally made of the same size unlike standard cell designs in which the transistors are optimized for speed, power, and density. Moreover, synchronous circuits such as flip-flops and the like exacerbate this problem since they are switched at every clock cycle. U.S. Pat. Nos. 5,341,041 and 5,289,021 disclose a new type of gate array architecture that includes three different sizes of transistors in a core cell. The core cell consists of two types of subcells. One subcell includes small and medium sized transistors and a second subcell includes large transistors. The choice of different sized transistor permits a better optimization of the speed and power of complex cells such as flip-flops. However, since a particular design does not necessarily use the three different transistor sizes in the proportion they are provided, many transistors are often wasted. Further, the inclusion of several different transistors makes the cell significantly larger, resulting in lower gate density. Other gate array structures that include multiple transistor sizes are disclosed in U.S. Pat. Nos. 4,816,887; 5,038,192 and 4,668,972. However, none of those approaches provide a metal programmable design with density and power that are comparable to standard cell.

Another major problem faced by integrated circuit designers is the routing of global signals. A lot of design time is spent minimizing the clock skew and power dissipation. As the minimum geometries used in the design of integrated circuits reach 0.25 micrometer and smaller, the global routes, such as clock, reset, test and power distribution can account for over 40% of the total metal routing resources as well as the power dissipation of a design. The current design methodologies disregard routing of these global nets in the initial placement of the logic cells. Typically, the cells are placed with the primary objective of reducing the wire length of signal interconnects between different logic cells. Consequently, a long clock signal has to be routed to all the flip-flops, resulting in large clock skew and high power dissipation. Also, since these global signals are routed after initial placement, the original placement is perturbed by the global signals, resulting in a time consuming, iterative design flow.

Accordingly, improvements to the state of the art are needed to solve the global routing and time to market problems of custom, standard cell, and gate array technologies, while still allowing high density design.

SUMMARY OF THE INVENTION

The present invention provides a gate array architecture and method of design for integrated circuits that provides fast design and manufacturing. These new gate arrays feature density and power comparable to standard cell designs, while retaining faster manufacturing and lower mask cost over standard cell.

According to an aspect of the present invention, the fabrication of an application specific integrated circuit (ASIC) has two steps, a pre-design fabrication process and a post-design fabrication process. In the pre-design fabrication process, the silicon wafer is prefabricated with standardized core cells without the design-specific customization of the functional aspect of the design. In the post-design fabrication steps the design-specific customization is completed using only the upper metal layers to quickly implement a specific design intent.

In a specific embodiment of the present invention, the predesign fabrication process extends up through the third level of metal (M1, M2, and M3), though other embodiments may prefabricate more layers without departing from the spirit, intent, and the scope of the present invention. A designer then provides design-specific information to customize the design for a particular application. This customization is done using only the higher metal layers—in the specific embodiment, metal layers four and five (M4 and M5). Accordingly, fabrication after design completion need only be completed for the upper layers, further reducing the turn around time and the mask costs for fabrication as compared to a conventional all-metal programmable gate array or conventional standard cells.

According to another aspect of the present invention, a method of designing an integrated circuit is provided. The method includes forming transistors in a semiconductor substrate, forming metal layers on adjacent metal layers above the semiconductor substrate, and using a metal layers to connect the transistors to form a plurality of substantially similar basic cells. The metal layers are also used to connect the various transistors in the basic cells to power signals. A designer then customizes these predesigned basic cells with design specific traces using a metal layer above the first plurality of metal layers that were used to form the basic cells and power connections.

According to another aspect of the present invention, a semiconductor integrated circuit device useful for forming customized circuits is provided. This device comprises a plurality of predesigned basic cells based on the semiconductor substrate. Each predesigned basic cell includes a plurality of transistors and three metal layers immediately adjacent to the semiconductor substrate (separated by insulating layers). At least one of the metal layers provides electrical coupling among the transistors to define functionality of the predesigned basic cells. Additionally, at least one of the metal layers provides electrical coupling between the transistors and a power source such that the semiconductor integrated circuit can be fully customized by use of only the metal layers above the third metal layer.

A further understanding of the nature and advantages of the inventions described herein may be realized by reference to the remaining portions of the specification and the attached drawings.

BRIEF DESCRIPTION OF THE DRAWINGS

FIG. 2A shows a diagram of the architectural layout of a functional circuit block;

DESCRIPTION OF THE SPECIFIC EMBODIMENTS

Figure 1:
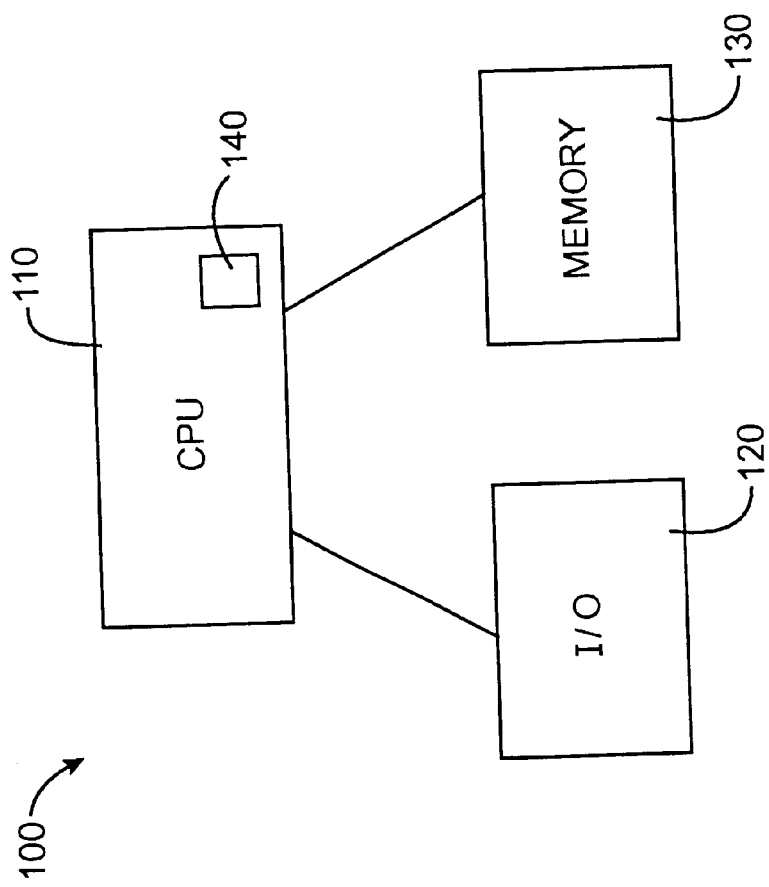
FIG. 1 is an illustration of a digital system into which an embodiment of the present inventions may be incorporated.

FIG. 1 is an illustration of an exemplary digital system 100 into which an embodiment of the present inventions may be incorporated. Digital system 100 includes a central processing unit 110, which may be a microprocessor, microcontroller, state machine, or other processing units. An input/output unit 120 is coupled to CPU 110 either directly or indirectly and may include items such as a keyboard, mouse, display device, printer, interface card, network adapter, and the like. Digital system 100 also includes a memory 130 coupled either directly or indirectly to CPU 110 which may include a RAM, ROM, floppy disk drive, hard disk drive, CD ROM, DVD, and the like. An integrated circuit 140 embodying the present invention is included in CPU 110. Though shown in FIG. 1 as an element of CPU 110, integrated circuit 140 may be included in each of the various units or any combination thereof. Similarly, multiple integrated circuits 140 may be included in any or all of the units.

Referring to FIG. 2A, integrated circuit 140 includes one or more functional circuit blocks 200 that are specially designed to efficiently provide both synchronous and asynchronous logic for use by the designer. FIG. 2A is a high-level architectural layout of an exemplary functional circuit block 200. In accordance with the specific embodiment of the present invention, integrated circuit 140 comprises one or more functional circuit blocks 200. A plurality of functional circuit blocks 200 may be preferably arranged in integrated circuit 140 in an array structure with corresponding regions lining up in columns or rows. For example, integrated circuit 140 may include one or more columns of functional circuit blocks 200 with several functional circuit blocks 200 in each column. Such an arrangement allows easy routing of signals and efficient use of space as will be described below. Integrated circuit 140 may also include other elements such as full custom logic, Field Programmable Gate Arrays (FPGA), standard cell or gate arrays, Random Access Memories (RAM), and the like. Such elements may be interspersed throughout integrated circuit 140 or confined to certain areas.

As shown in FIG. 2A, functional circuit block 200 comprises at least two distinct regions. For example the specific embodiment includes an asynchronous region 210 for non-clocked cells optimized for the design of combinational logic cells such as AND, OR, EXOR, MUX, etc. and synchronous regions 212 for those cells that use a clock such as flip-flops, latches, clock buffers, registers, and the like. Since the clocked cells are limited to a specific region, clock signals may be routed only to the synchronous region 212. This restriction reduces the length of the clock net by a large factor, resulting in lower clock skew and much lower power dissipation in clock lines. Flip-flops and other synchronous elements that are placed in synchronous regions 212 can be directly connected to the clock signal.

The placement of clocked cells in synchronous region 212 can be achieved by one of several techniques. In one approach, placement software supports two or more cell types and each cell is associated with a type. For example, all of the flip-flops in a particular design may be designated as being of synchronous-type and combinational logic cells may be designated as asynchronous-type. The placement software examines the cells and places all of the cells of a particular type in the corresponding region. For example, synchronous-type cells are placed in synchronous region 212 and asynchronous-type cells are placed in asynchronous region 210. In an alternate approach, the placement software places blockages in the design such that clocked elements are blocked from being placed in asynchronous region 210.

In addition to limiting clock distribution to a specific region of the integrated circuit, global power busses may also be limited to only certain regions of the integrated circuit. In the example of FIG. 2A, the global power busses running in the vertical directions would be placed over the synchronous regions 212. This places the power busses closer to the high-power consuming synchronous cells such as flip-flops. In addition, high-drive signal buffers 260 used for clocks and global nets are placed in this region under the global power busses. This provides for lower voltage drop and lower electro-migration than the current design approaches in which the high-drive cells are placed throughout the integrated circuit without any restrictions, even in places where the power bussing is not adequate.

In the specific embodiment, asynchronous region 210 is bracketed on each side by synchronous regions 212. Other layouts for functional circuit block 200—including those with more or fewer regions or those with different relative locations of these regions—may readily be comprehended. For example, a functional circuit block may include a synchronous region bracketed by two asynchronous regions, or the synchronous regions may be on the top and bottom edges of the asynchronous region. An integrated circuit 140 may be comprised of many circuit blocks 200 that have different arrangements of the synchronous and asynchronous regions.

Asynchronous region 210 is populated with a plurality of asynchronous cells 220. A typical functional circuit block may have as many as 1,000 or as few as 150 asynchronous cells—although any number may be used in accordance with the present invention. Asynchronous cells 220 may be preferably arranged in an array pattern for efficient routing and use of space. Asynchronous cells 220 are discussed in more detail below; but in general, asynchronous cells 220 are differentiated from other cells in that no predefined clock is provided as part of the architecture. As is well known in the art, asynchronous cells 220 may be connected in various ways to provide a synchronous function, including the use of a clock. Such use is not outside the scope of the present invention. Of course, such use may not benefit from all of the advantages of adhering to the guidelines of the architecture, but will be no worse than conventional architectures.

In order to ease the automated placement of the two types of cells, in a specific embodiment of the invention the height and width of synchronous cells 240 bear one or more of the following relationships with the height and width of asynchronous cells 220: (1) the height of the asynchronous cell 220 is same or an integer multiple of the height of synchronous cell 240; (2) the width of synchronous cell 240 is an integer multiple of the width of asynchronous cell 220; and, (3) the total width of asynchronous region 210 bound by two synchronous regions 212 is an integer multiple of the width of synchronous cell 240.

Figure 2B:
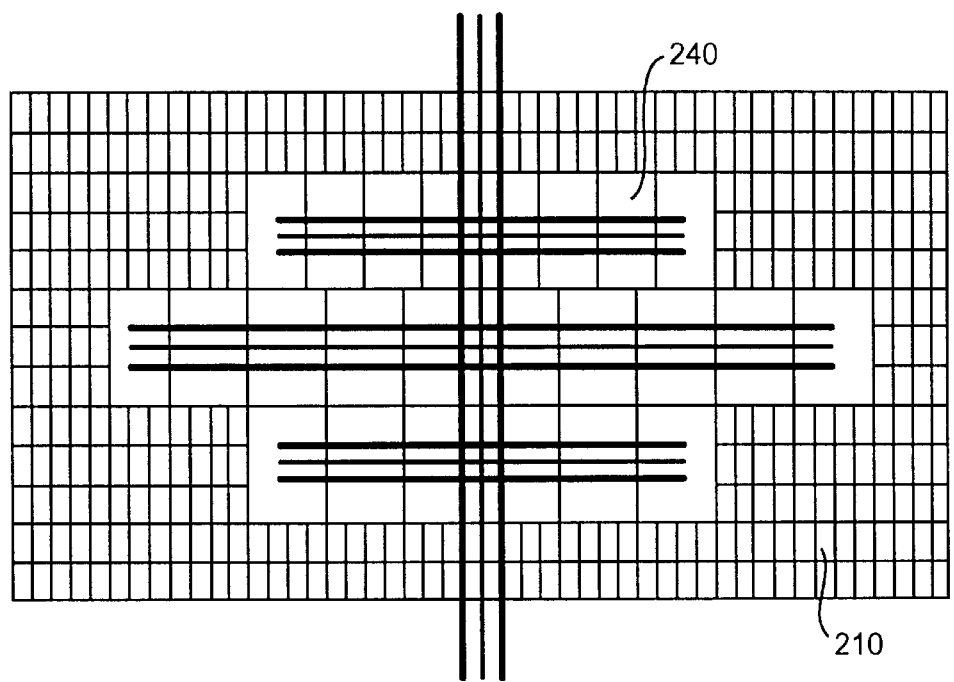
FIG. 2B shows a diagram of an alternative architectural layout of a functional circuit block.

Synchronous regions 212 are each populated with a plurality of synchronous cells 240. In the specific embodiment, synchronous cells 240 are arranged in a column. Although a typical column will have 20 to 80 cells, architectures with fewer or more cells may be easily comprehended. Synchronous cells 240 are described in detail below but are generally characterized as storage elements that operate under control of one or more clock signals or as clock buffers or clock splitters that produce clock signals. A clock splitter generates the true and complementary clock signals, thereby allowing these signals to be shared between the many synchronous cells 240 rather than generating signals for each flip-flop in the design. The arrangement shown in FIG. 2A is advantageous in that it allows for easy interconnection between adjacent functional circuit blocks 240 by abutting functional circuit blocks 240 together in vertical columns. This also permits the sharing of clock buffers between a group of flip-flops, thus reducing the number of buffers. Of course, one may readily envision synchronous cells 240 arranged in a variety of other ways such as in multiple columns on each side of asynchronous region 210, in columns on the interior of asynchronous region 210, in horizontal rows on the interior or exterior of asynchronous region 210 or other configurations. FIG. 2B shows an alternative embodiment wherein synchronous cells 240 are clustered in the interior of asynchronous region 210. In other embodiments a column of synchronous cells 240 may include two columns of flip-flops placed side by side. The columns (or rows) of synchronous cells 240 may have gaps in them where asynchronous cells 220 may be placed.

In one specifically beneficial embodiment of this invention, synchronous cells 240 and asynchronous cells 220 are two different individually optimized metal programmable core cells. These two core cells are: i) a synchronous core cell that leverages diffusion and polysilicon routing, optimized to implement flip-flops; and, ii) an asynchronous core cell, optimized for the design of combinational logic cells such as AND, EXOR, MUX etc. The synchronous core cells 240 and asynchronous core cells 220 are placed in synchronous region 212 and asynchronous region 210 of the chip respectively. Additional core cells may be provided for special functions such as high-drive buffers 260, or they may be designed using the either of the first two types of core cells. By separating and optimizing the functions of each core cell, the height of both the core cells is reduced by 20% or more, achieving for example, a 8 grid high gate array cell—the same height as standard cell. In the prior art the gate array height is generally limited to 10 grids or more. Additional increase in gate density is achieved by the use of a specific synchronous core cell to design flip-flops. Traditional gate array core cells are fairly inefficient at implementing the flip-flops, resulting in a flip-flop that is 30% to 40% wider than that in standard cell. In the present invention, the use of a special core cell makes the height and the width of the flip-flop cell similar to that of standard cell. Details of these metal programmable core cells are described below.

The use of pre-specified regions for different types of cells results in significant savings in the metal resources used by global nets such as clocks, reset, scan, power busses and global signals. Such savings can be much greater than any increase in the local interconnect lengths caused by the restricted placement of cells. The physical partitioning of an integrated circuit area into synchronous and asynchronous regions also has a beneficial effect on the placement and routing of a large design.

Though the specific embodiment describes an architecture that is separated into synchronous and asynchronous regions, other embodiments may have regions based on other criteria. For example, in an alternative embodiment, low-drive cells may be grouped in a first region and high-drive cells grouped in a second region. In such a design, high-drive buffers could be grouped and shared in the second region and commonly used high-drive power traces economically routed throughout the second region.

Referring again to FIG. 2A, functional circuit block 200 may include one or more regions for placement of high-drive buffers 260. High-drive buffers 260 provide signal buffering and delay matching for clock signals serving synchronous cells 240. In the specific embodiment, each column of synchronous cells 240 has a local clock buffer 260 at each end. By this arrangement, clock buffers may be shared between several synchronous cells 240. The function and design of local clock buffers 260 are well known in the art. These clock buffers 260 may be of variable drive strength and may be programmed electrically or programmed using a mask layer. In an alternative embodiment, a local clock buffer may be located in the middle of a column of synchronous cells 240 with clock signals extending therefrom in either direction. The high-drive buffers are also used to drive other long signal nets, in addition to the clock. For example, high-drive buffers 260 may drive power signals to synchronous cells 240. In one embodiment of this invention, the high-drive cells are designed by metal programming of the same core cell that is used to form flip-flops. This allows the buffers to be placed anywhere in synchronous region 212.

Figure 3:
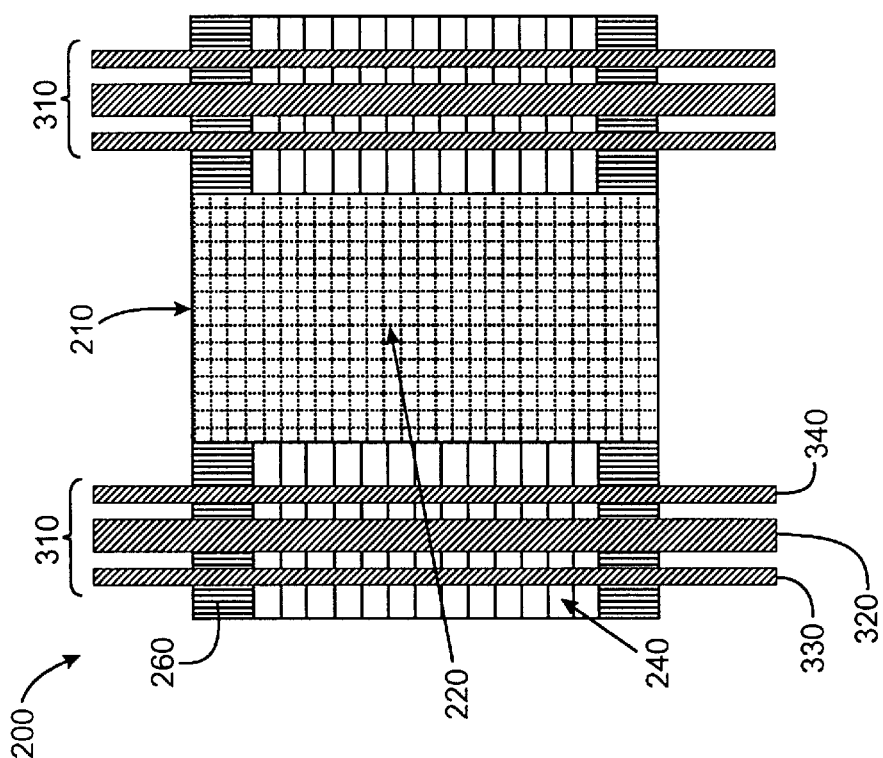
FIG. 3 illustrates an embodiment of how clock traces may be routed within a functional circuit block.

FIG. 3 illustrates routing of various global traces 310 specific to synchronous cells 240 according to the specific embodiment of the present invention. For simplicity, FIG. 3 shows only a clock trace 320, a VSS power trace 330 and a VDD power trace 340, but it will be recognized that other global signals associated with synchronous cells 240 such as clock, clock bar (the inverse of the clock signal), reset, enable, scan enable, scan enable bar, VSS, VDD etc. may also be similarly routed. Global traces 310 extend vertically across synchronous cells 240 of functional circuit block 200 and preferably overlays each synchronous cell 240 in synchronous region 212. Because of the regular layout of synchronous cells 240, global traces 310 may be laid out in a regular pattern with straight traces. To further minimize the lengths of the global traces 310, they are preferably routed in a direction that is orthogonal to the longer dimension of synchronous cells 240. For example, a typical synchronous cell 240 may be 24 grids wide in the X direction and only 8 grids tall in the Y direction. In this case the global traces are routed in the Y direction. This arrangement minimizes the area necessary to route global traces 310. Because of the efficiency of this layout, global traces 310 are shorter and more balanced than designs that route clock traces to random areas of the integrated circuit, thus minimizing capacitance, clock skew, propagation delay, power dissipation etc. In an embodiment of the present invention, identical numbers of synchronous elements 240 are connected to clock trace 320 in each synchronous region 212—even if some of them are not used—thus maintaining symmetry and balance in the clock. In other embodiments, clock traces associated with multiple clock signals may be routed to each synchronous region 212 with some or all of the synchronous cells in synchronous region 212 connecting to the clock traces from different clock signals.

VSS and VDD power traces 330 and 340 are also routed over synchronous regions 312. They are placed adjacent and on opposite sides of clock trace 320 and are typically wide traces. This arrangement provides shielding from coupled noise as well as a lower clock skew for clock trace 320. The wide power traces also provide a low resistance power source for high-drive cells 260 and the synchronous cells 240 that are switched at every clock cycle.

Figure 4:
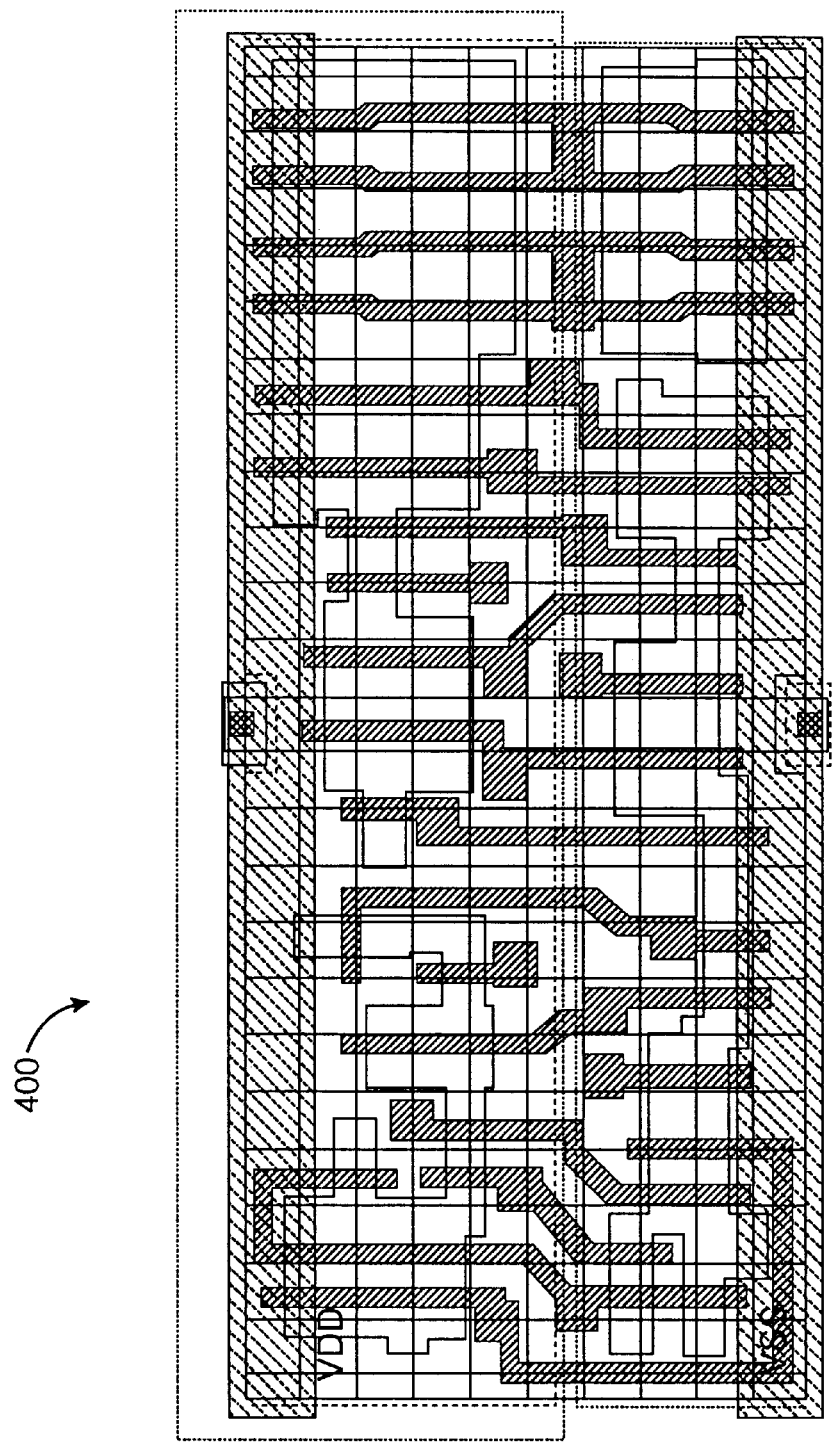
FIG. 4 shows a metal programmable, synchronous core cell according to an embodiment of the present invention without the metal layers.

FIG. 4 shows a preferred embodiment of pre-fabricated synchronous core cell 400 that may be used as synchronous cell 240. Synchronous core cell 400 may be customized using the metal layers (not shown in FIG. 4) to implement a D-type flip-flop with scan and reset functions, or other types of synchronous element such as flip-flops, latches, registers and the like. Each synchronous cell 240 in synchronous region 212 may be identically customized from the same core cell 400. Alternatively, synchronous region 212 may include two or more different types of synchronous elements each personalized differently from the same core cell 400 or different core cells 400 may be provided for various customizations. In the specific embodiment, each synchronous cell 240 is a D-type flip-flop, with scan and reset, formed from core cells 400 arranged in a column.

Figure 5A:
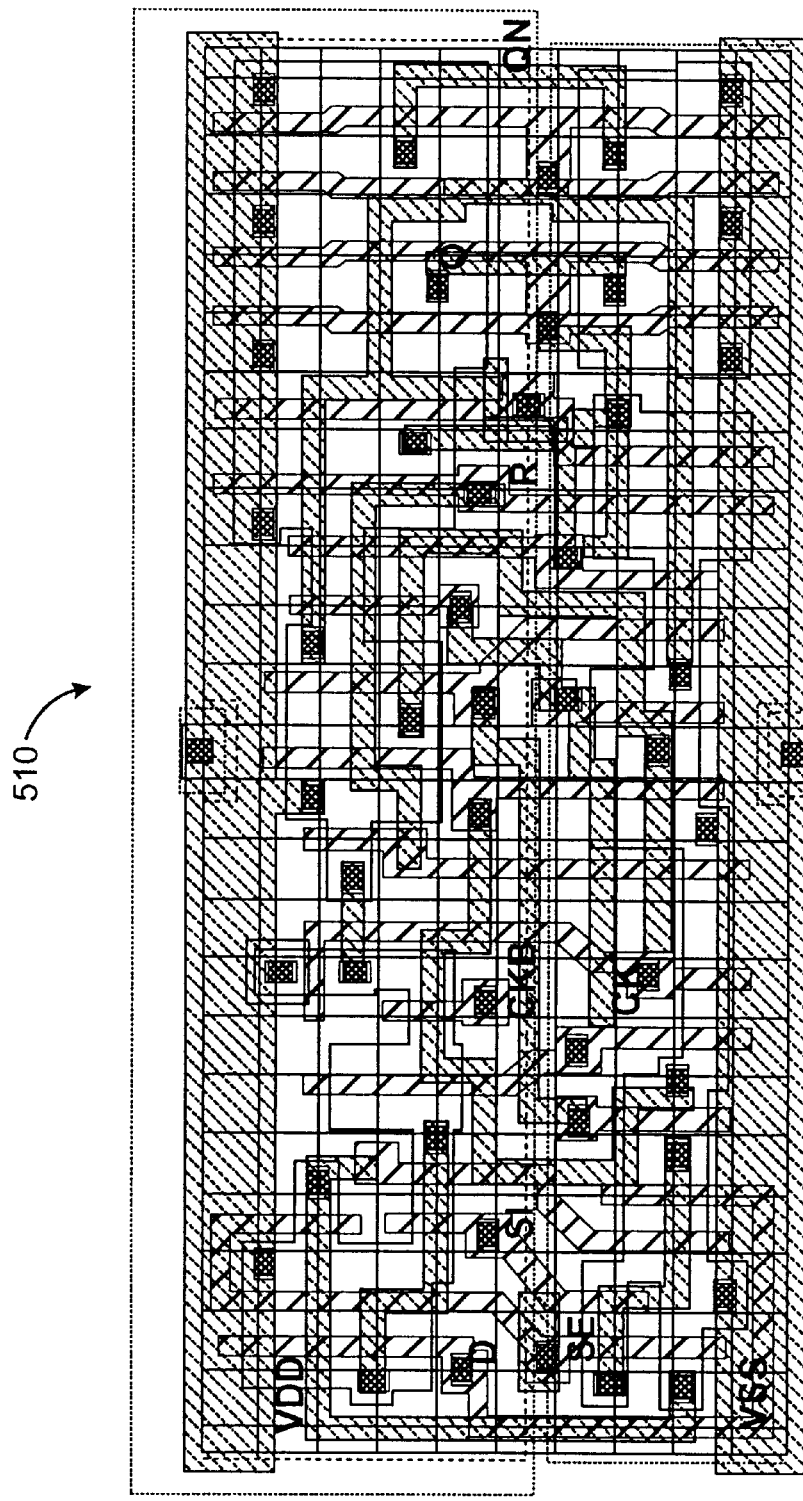
FIG. 5A shows the synchronous core cell of FIG. 4 with metal 1 pattern designed to form a flip-flop with scan and reset.

In accordance with the specific embodiment of the integrated circuit architecture described herein, the basic functionality of synchronous cell 240 is formed entirely within the first two metal layers (M1 and M2). FIG. 5A shows the layout of synchronous core cell 240 programmed using the first metal layer to perform the function of a D-type flip-flop 510. At this level of abstraction, the logical function and necessary input/outputs terminals of D-type flip flop 510 are provided including a D-input (D), a scan input (SI), a scan enable (SE), a clock input (CK), an inverse clock input (CKB), a reset input (R), an output (Q), an inverse output (QN), a power input (VDD) and a reference (or Ground) input (VSS). The functionality of these input/output terminals will be well known to one of skill in the art. Of course, other types of synchronous elements may have different input/output terminals as appropriate for the functionality of the element.

Figure 5B:
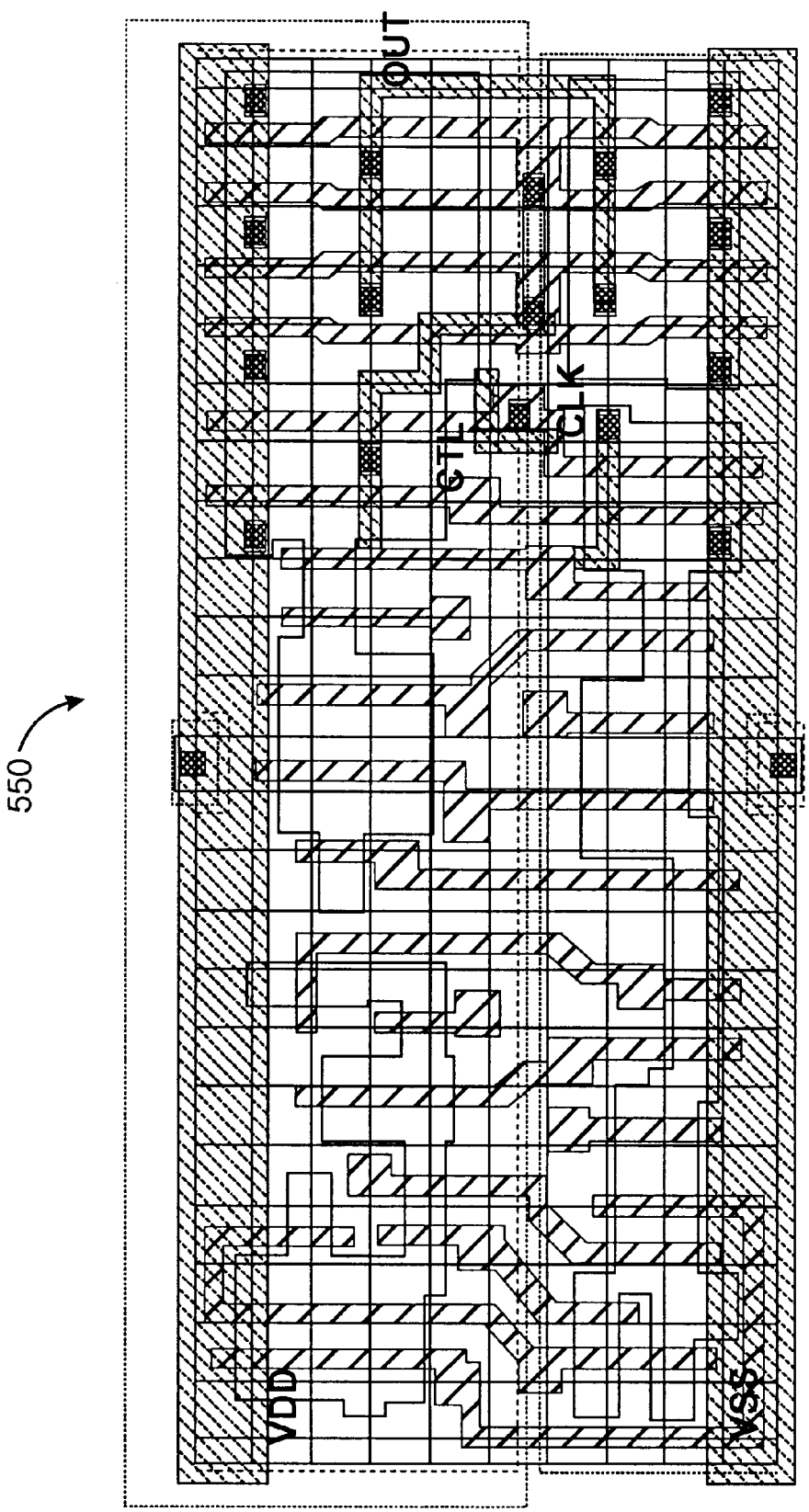
FIG. 5B shows the synchronous core cell of FIG. 4 with metal 1 pattern designed to form a clock buffer.

FIG. 5B illustrates an alternate metal programming pattern used with the synchronous core cell 400 in FIG. 4. In this alternative embodiment, a buffer circuit 550 is implemented using the same core cell 400. The example circuit has a clock input (CLK), output (OUT) and a control input (CTL). Similarly, other functions such as latch or multiplexor may also be implemented using the same synchronous core cell 400.

Figure 5C:
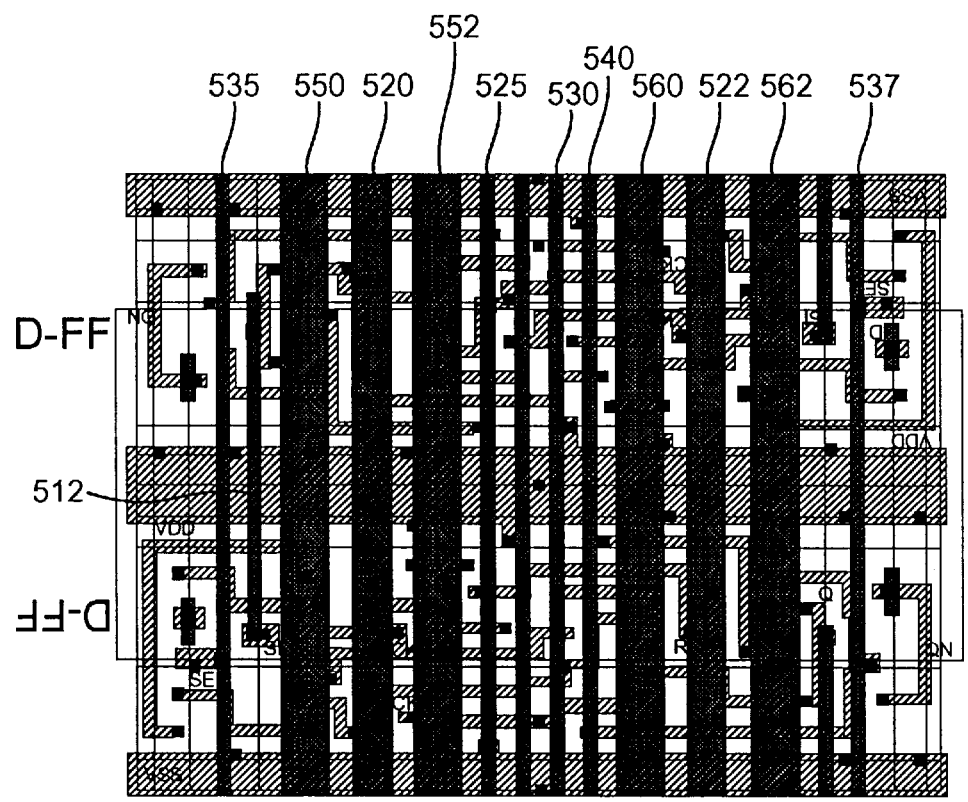
FIG. 5C shows two adjacent synchronous cells according to the present invention abutting each other.

FIG. 5C illustrates in more detail the routing of global traces 310 on the third metal (M3) layer across synchronous cells 240. FIG. 5C also shows two adjacent synchronous cells 240 that abut each other in a column. Though only two synchronous cells 240 are shown, a given column may include several replications of the portion shown in FIG. 5C. In the specific embodiment, adjacent synchronous cells 240 are placed such that adjacent synchronous cells are rotated 180° with respect to each other. A mirror image placement may also be comprehended either instead of or in addition to this rotational relative placement. As shown, this allows common signals to be easily coupled. For example, the output Q can be coupled to the scan-in input (SI) with a single straight scan trace 512. Preferably, several different scan chains are used to decrease the time necessary to test the design.

In the specific embodiment, global traces 310 are routed on the M3 layer. The specific embodiment includes two global clock traces 520 and 522, a local clock trace 525, a local clock bar trace 530, scan enable traces 535 and 537, and a reset trace 540. Preferably, the global clock traces 520 and 522 are bracketed by VDD traces 550 and 552, and VSS traces 560 and 562, respectively. These power traces serve as shields for the global clock traces 520 and 522 to reduce crosstalk from and to other traces. Local clock traces 525 and 530 are also shielded by power supply traces or quiescent traces such as reset trace 540. Clock traces are preferably routed in a direction parallel to the smaller dimension of synchronous cell 240. This helps to reduce the length and the capacitance of the clock lines. Also, if lower capacitance is desired, the distance between clock trace 520 and power traces 550 and 552 may be increased, for example.

In one specific embodiment of the present invention, the traces providing VDD to the block have two independently controlled sources in order to reduce power dissipation during the standby mode. For example, trace 550 may carry a VDD1 voltage that is supplied to the master latch of the flip-flop. Another trace 560 is connected to a second voltage source VDD2, which is connected to the slave latch of the flip-flop and to the asynchronous region adjoining the flip-flop. When an integrated circuit is in a standby mode, VDD2 may be lowered to reduce leakage current. At the same time, VDD1 and the clock are maintained high such that the data stored in the flip-flop is not lost. The localization of the flip-flops in specific regions makes such a power-saving arrangement practical. The rotation and mirroring of the flip-flops must be more carefully controlled in this embodiment.

Although the example above uses the M3 level for routing the clock and power signals over the synchronous region, in other implementations M2 or other metal levels may be used without significant deviation from the spirit or the scope of this invention.

Referring again to FIG. 2A, asynchronous region 210 lies between synchronous regions 212. Asynchronous region 210 includes a plurality of asynchronous elements 220 which may be formed using any of a variety of core cells currently known in the art or later developed. Asynchronous elements 220 are preferably arranged in an array for efficient use of space and routing.

Figure 6B:
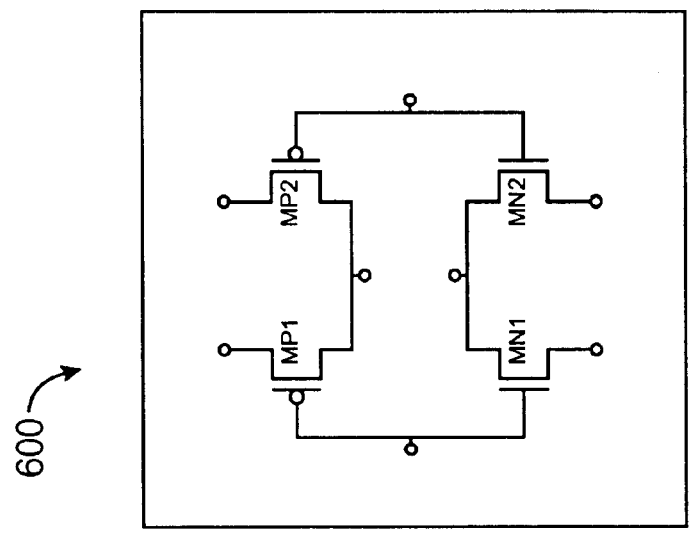
FIGS. 6A and 6B show an exemplary four transistor, metal programmable core cell that may be used to implement asynchronous cells.
Figure 6A:
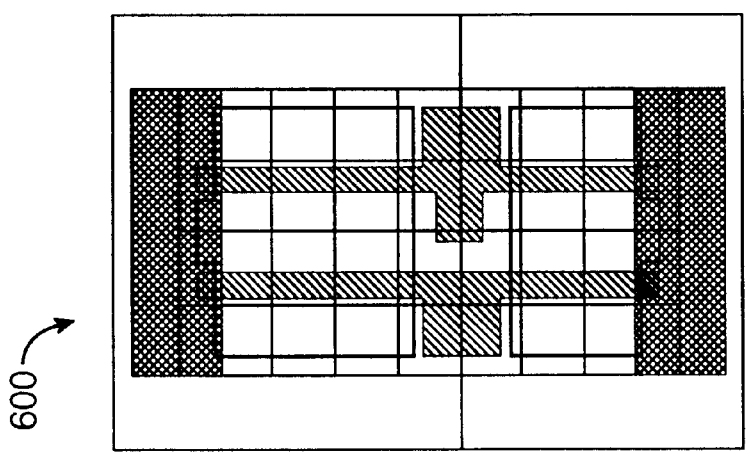
Figure 6E:
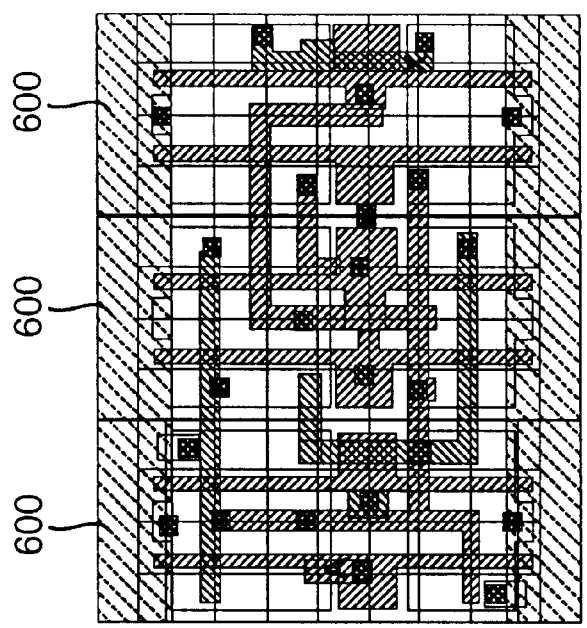
FIGS. 6C–6E show three logic functions created by metal 1 programming of the asynchronous core cell of FIG. 6A.
Figure 6D:
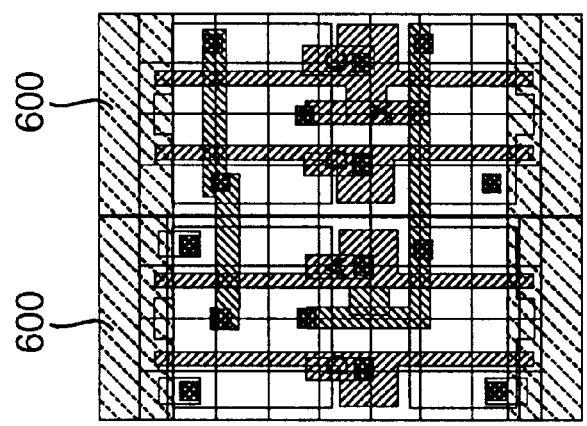
Figure 6C:
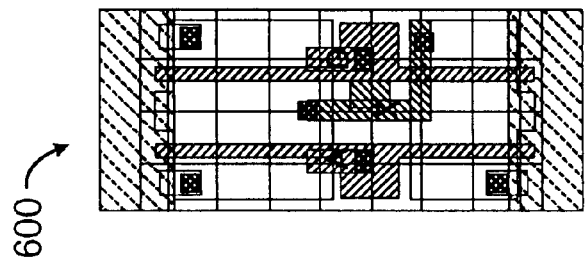

FIG. 6A illustrates an exemplary four-transistor asynchronous core cell 600 that may be used for asynchronous logic elements 220. A schematic representation of asynchronous core cell 600 is shown in FIG. 6B. Asynchronous core cell 600 may be used singly or in a group to form logical functions such as invert, NAND, NOR, XOR, MUX and the like. FIGS. 6C, 6D, and 6E show examples of different metal programming patterns used to implement some of the more popular logic functions using a single asynchronous core cell 600 or multiple asynchronous core cells 600. FIG. 6C shows a 2-input NAND gate implemented with a single asynchronous core cell 600.

FIG. 6D shows an AND-OR-INVERT using two asynchronous core cells 600 and FIG. 6E shows an XOR using three asynchronous core cells 600.

Different logic functions may also be implemented using combinations of synchronous core cell 400 and asynchronous core cell 600 described above. For example, a flip-flop with high-drive output may use one synchronous core cell 400 and one or more asynchronous core cell 600. Asynchronous core cell 600 is used to design the high-drive output stage and the rest of the flip-flop is designed using the synchronous core cell.

Although metal programmable cells are used in the above description to implement the asynchronous logic, standard cells may also be used in their place. A standard cell implementation will use all mask layers to customize the cell implementation. As a result it will produce a somewhat denser and lower power design. However, it will cost longer time to manufacture the design and higher mask costs in comparison to gate array cells.

According to another aspect of the present invention, asynchronous elements 220 may be predesigned as core cells on the lower levels of metal, leaving the remaining upper metal layers to be customized by the designer in a post design fabrication process. In the specific embodiment, the first three metal layers (M1, M2, and M3) are predesigned and prefabricated to form the core cells and predesigned global nets such as power supply busses, clocks, reset and scan connections. The synchronous elements are also primarily implemented using M1–M3 levels. The remaining two metal layers (M4, M5) are fabricated after the design is completed to provide design-specific customization of the core cells and interconnections between the cells. Synchronous elements 212 may be similarly predesigned on the lower metal layers. Since only the higher metal layers need be personalized after completion of a design, fewer masks are needed and fewer layers need to be fabricated following the design process resulting in a much faster turnaround time and lower NRE (nonrecurring engineering) cost as compared to the current state of the art conventional methodologies.

Another advantage of predesigning and prefabricating circuit elements up to M3 is that interim tests may be performed on the prefabricated silicon wafers before design completion based on performance or other criteria. Previously, parts were tested and separated into bins only after fabrication completion based on performance ranges. For example, parts may have been separated into 500 MHz parts, 600 MHz part, etc. Higher performing parts were then typically sold for higher prices. However, many high-performance designs do not have a market for low or medium performing circuits. In such cases, the medium to low performing wafers are discarded after test. Similarly in many consumer applications, the high performing wafers do not attract higher prices. If the performance of a wafer could be predicted before it is selected for a specific design, then a significant increase in its value can be realized.

Yet another advantage of this architecture is the placement of contacts to the substrate or well from the core cells. Since the layout is structured, the substrate/well contacts within the synchronous cells may be well distributed throughout the chip. Therefore, none are necessary in the asynchronous cells. Conversely, the substrate/well contacts may also be made within the asynchronous cells and not made at all in the synchronous cells.

The prefabricated wafers of the present invention may be tested and separated before design-specific application. For example, a test circuit such as a ring oscillator or a random-access memory may be provided in the first three metal layers. After prefabrication of the wafers, the wafers may be tested and separated into performance categories. The faster predesigned wafers may then be sold for a premium for use in high performance parts. The later customization of the higher metal layers may be completed on a predesigned part known to be of high performance. Thus, higher product yields may be accomplished and slow parts are not wasted.

Figures 7A, 7B:
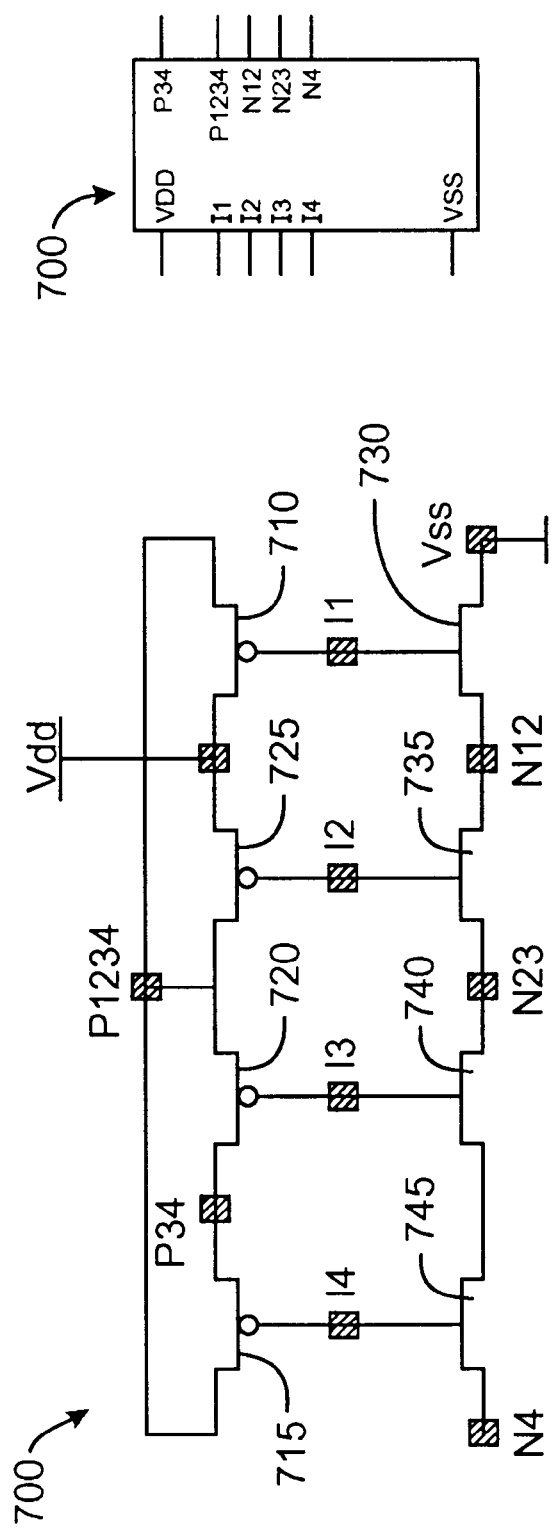
FIGS. 7A and 7B show a cuit diagram and logic symbol of a specific embodiment of an eight transistor a chronous core cell according to an aspect of the present invention.

FIG. 7A shows a circuit diagram of the functionality of a core cell provided by the specific embodiment of a predesigned asynchronous core cell 700 that may be used as asynchronous element 220. Predesigned asynchronous core cell 700 is provided to designers to create desired logic function by personalizing only the higher metal layers as described below. Predesigned asynchronous core cell 700 of the specific embodiment is an 8-transistor circuit—though variations to this circuit may be substituted without departing from the scope of the present invention. Preferably, asynchronous element 220 is designed to easily create the various logic functions anticipated for a particular application. Moreover, a particular functional block element 200 may include a plurality of asynchronous elements 220 identical to predesigned asynchronous core cell 700, or many different predesigned asynchronous elements may be included. In some embodiments, the interface presented by the predesigned asynchronous elements on the M3 layer may be identical, but the underlying patterns on M1 and M2 may be different to allow different routing patterns on different areas of the integrated circuit. For example, all of the asynchronous cells in a first row may be different than those in a second row allowing different routing through the different rows.

In the specific embodiment of asynchronous core cell 700—which is designed to be particularly effective in a CMOS design—a first transistor 710 has a first terminal connected to VDD and a second terminal connected to a first terminal of a second transistor 715. The second terminal of second transistor 715 is connected to a first terminal of third transistor 720. The second terminal of transistor 720 is connected to a the first terminal of a fourth transistor 725 which has its second terminal connected VDD (thus it is also connected to the first terminal of transistor 710.) A fifth transistor 730 has a first terminal connected to VSS and the second terminal connected to a first terminal of a sixth transistor 735. The second terminal of sixth transistor 735 is connected to a first terminal of seventh transistor 740. The second terminal of seventh transistor 740 is connected to a first terminal of an eighth transistor 745. The second terminal of eighth transistor 745 is left unattached. The gates of first transistor 710, second transistor 715, third transistor 720 and fourth transistor 725 are connected to the gates of sixth transistor 730, eighth transistor 745, seventh transistor 740 and sixth transistor 735, respectively. The connection between third transistor 720 and fourth transistors 725 is also coupled to the connection between first transistor 710 and second transistor 715. In the specific embodiment, first transistor 710, second transistor 715, third transistor 720 and fourth transistor 725 are p-type transistors, while fifth transistor 730, sixth transistor 735, seventh transistor 740 and eighth transistor 745 are n-type transistors.

FIG. 7A identifies several input/output connection ports (e.g., N12, N23, N4, I1, I2, I3, I4, P34, and P1234.) These connection ports in FIG. 7A indicate logically the points at which a designer may access the circuit using metal traces on the outer metal layers. FIG. 7B shows a logic symbol representative of predesigned asynchronous core cell 700 with its various connection ports.

Figure 8:
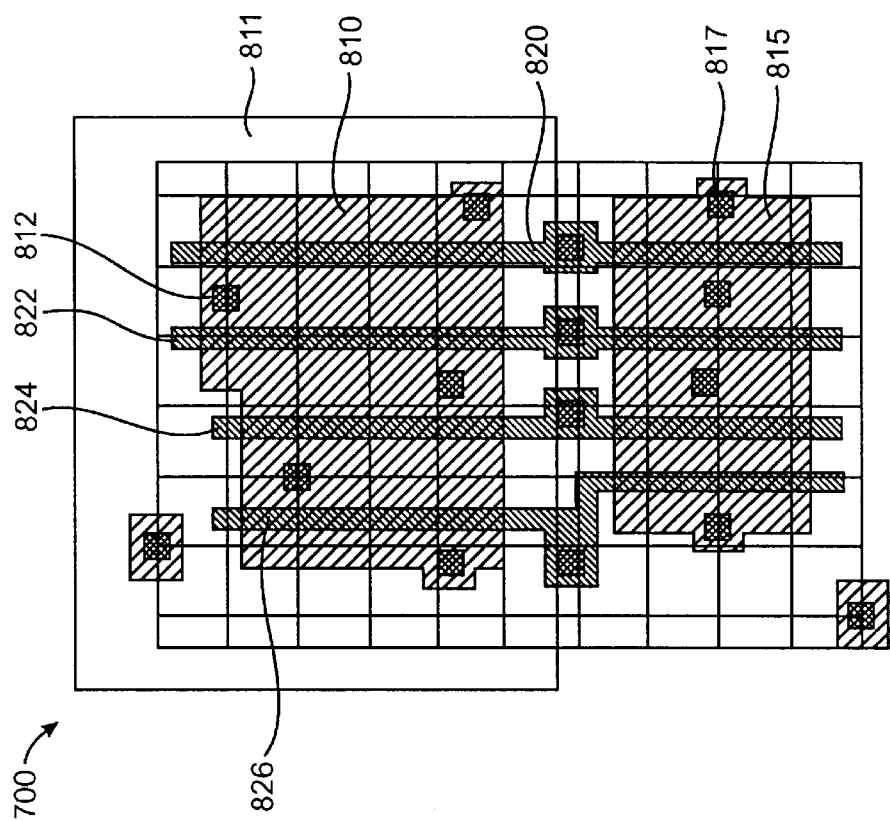
FIG. 8 is a layout diagram of the diffusion, polysilicon, and contact layers of asynchronous core cell of FIG. 7.

FIGS. 8–11 show layout diagrams of predesigned asynchronous core cell 700 at various layers of the integrated circuit. Each successive figure adds another layer to the previous layout diagram. FIG. 8 is a layout diagram of the diffusion and polysilicon layers of predesigned asynchronous core cell 700. A first diffusion region 810 is doped with a p-type dopant inside an n-type well 811. First diffusion region 810 is coupled to VDD through contact 812. A second diffusion region 815 is doped with an n-type dopant. Second diffusion region 815 is coupled to VSS through contact 817. A first polysilicon trace 820 extends across first diffusion region 810 and second diffusion region 815 forming first transistor 710 and fifth transistor 730, respectively. Second through fourth transistors 715–725 and sixth through eighth transistors 735–745 are similarly formed as shown in FIG. 8 with polysilicon traces 822, 824 and 826, respectively extending across first diffusion region 810 and second diffusion region 815. Of course, the layout diagram of FIG. 8 is but one embodiment of a suitable layout to implement some of the principles of the present invention. Other layouts are similarly desirable and will be suggested to one of skill in the art from the layout diagram shown in FIGS. 8–10.

Figure 9:
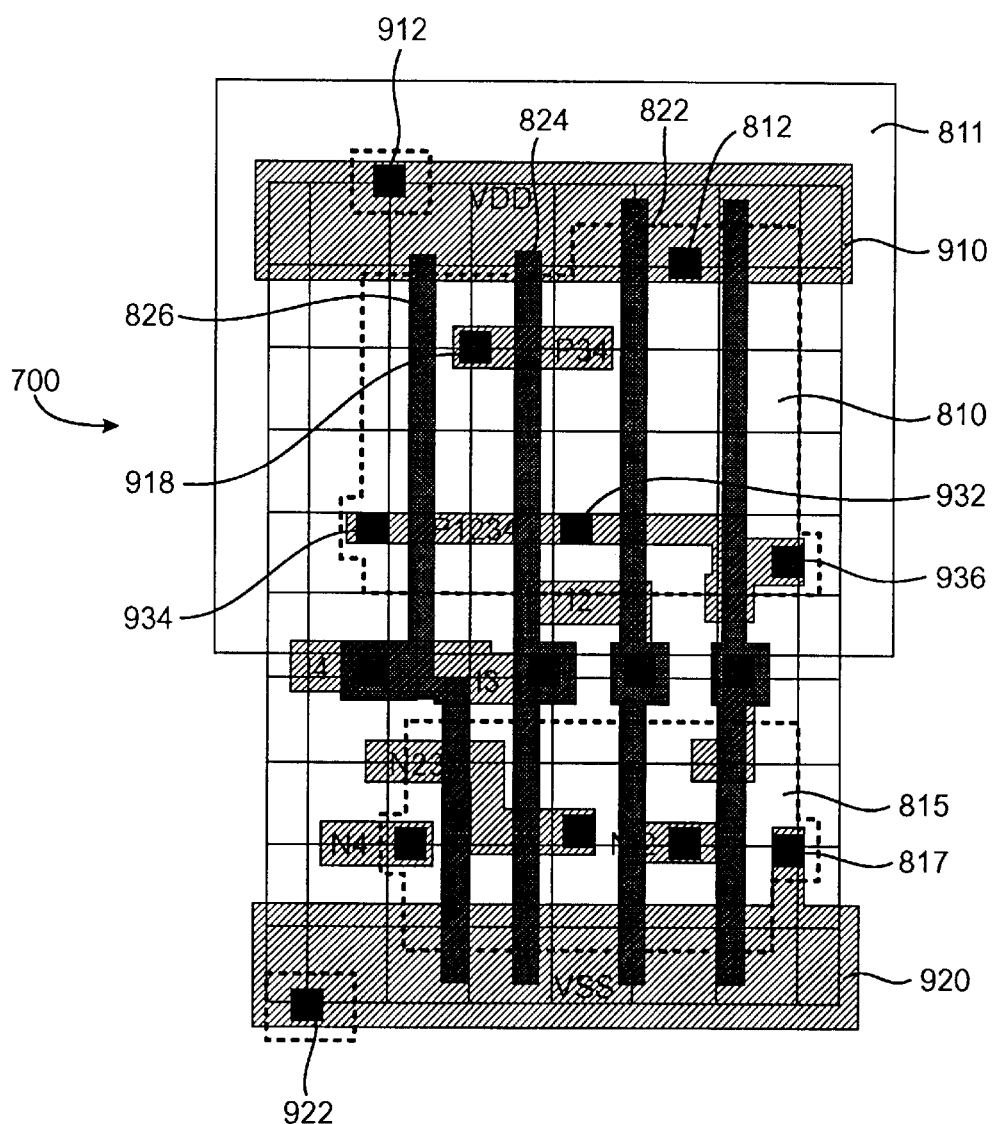
FIG. 9 is a layout diagram of the asynchronous core cell of FIG. 8 further including the M1 layer.

FIG. 9 illustrates the layout diagram as shown in FIG. 8 and further including the first metal layer (M1) for predesigned asynchronous core cell 700. In general, M1 is used for three purposes: to interconnect transistors in a predetermined order, to route power supplies VDD and VSS to asynchronous cells 220, and to provide connections between the transistors and the M2 and higher metal layers. A VDD power trace 910 is coupled to the VDD power supply and extends across the top edge of asynchronous core cell 220. As described above, contact 812 couples VDD power trace 910 to first diffusion region 810. Another contact 912 couples VDD power trace 910 to the n-type well 811. A VSS power trace 920 is coupled to a reference power supply and extends across the bottom of predesigned asynchronous element (or core cell) 700. Contact 817 couples VSS power trace 920 to second diffusion region 815 and a contact 922 couples VSS power trace 920 to the substrate. A trace P34 is formed with a contact 918 between polysilicon trace 824 and 826. Another trace P1234 extends across first diffusion region 810 with a contact 932 between the polysilicon traces 822 and 824, a contact 936 on one side of polysilicon trace 820 and a contact 934 on one side of polysilicon region 826. Similarly, as shown in FIG. 9, the traces N4, N23, and N12 are formed in M1 layer with contacts connecting to diffusion region 815, and the traces I1, I2, I3, I4 are formed in M1 layer with contacts connecting to polysilicon traces 820, 822, 824, and 826 respectively, to implement the circuit of FIG. 7A. Even though this embodiment is described in context of a CMOS process with n-well and p-substrate, it is easily comprehended by one of skill in the art that this concept is applicable to all variations of CMOS technology such as triple-well CMOS or SOI (Silicon-On-Insulator).

Figure 10:
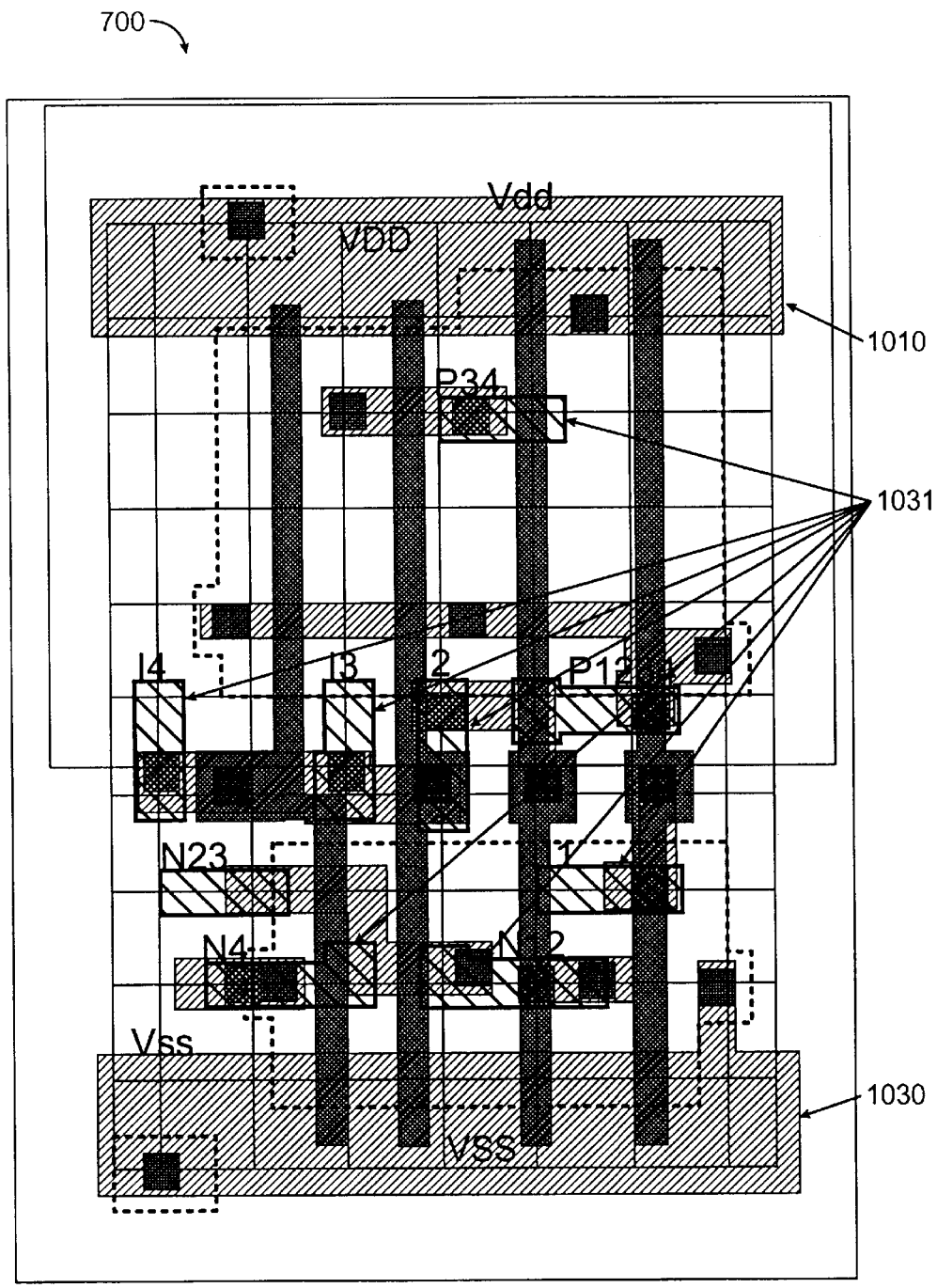
FIG. 10 is a layout diagram of the asynchronous core cell of FIG. 9 further including the M2 layer.

FIG. 10 shows the layout diagram of FIG. 9 further including the second metal layer M2. However, FIG. 10 shows an alternative embodiment of asynchronous core cell 700 in which VDD power trace 1010 and VSS power trace 1030 are formed on the M2 layer instead of the M1 layer. In the embodiment shown in FIG. 9, these traces could be absent altogether on the M2 layer, or could be used to route other global signals in lieu of power supply signals. M2 is generally used to route global signals in areas not used for cell design and to provide connections between transistors and the M3 and higher layers. Occasionally, M2 is also used to provide some fixed interconnect between transistors. In another alternative embodiment, M1 may carry one of the power supplies (i.e., VDD) and M2 carry the other power supply (i.e., VSS). It can be seen that a significant part of the M1 and M2 layers' routing resources are available for power and global signal routing. In the specific embodiment, traces 1031 are provided to route the signals of interest to appropriate locations for connection to the M3 layer as discussed below. It is desirable that these connections are short and do not block any more tracks on the M2 layer than necessary.

Figure 11:
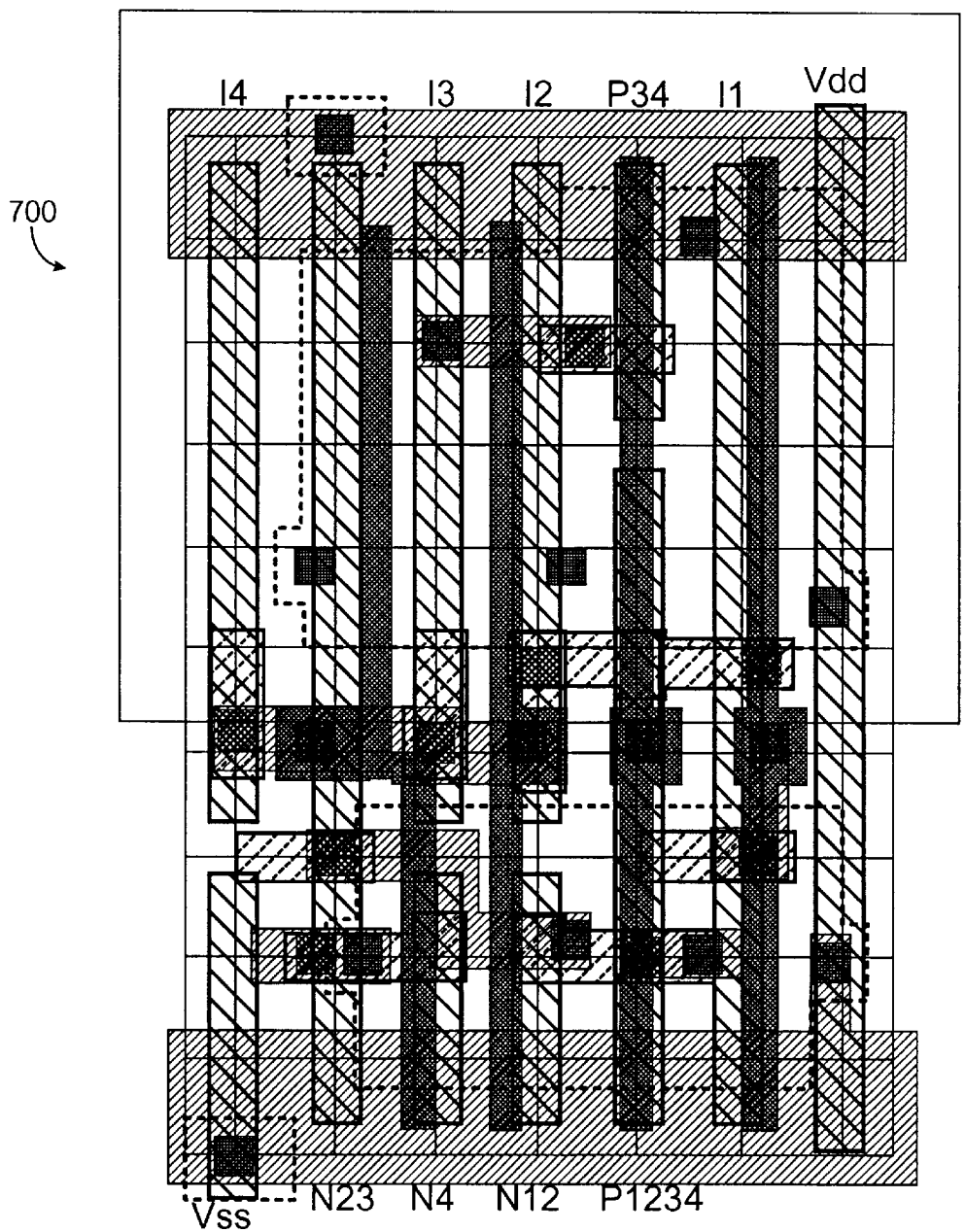
FIG. 11 is a layout diagram of the asynchronous core cell of FIG. 10 further including the M3 layer.

FIG. 11 shows the layout diagram of FIG. 10 further including the M3 layer. It represents the predesigned asynchronous core cell 700 as it exists prior to any design-specific customization by the user. In other words, it provides the building blocks, without any of the customization that create a particular function. That customization is added by a designer using only the higher layers of metal. The main purpose of the M3 layer is to provide connection ports (i.e., P1234, I1, N12, etc.) by which a designer may connect traces on the higher metal layers (i.e., M4 and M5) to customize asynchronous core cell 700 to form desired functionality. Preferably, these connection ports are designed to maximize the number of M4 layer tracks that can access them. This makes it easy for a user to customize asynchronous cell 700 using M4 to create logic functions such as inverters, NAND, NOR, multiplexors and the like. The various connection ports in FIG. 11 are labeled with the name of the connection port within the schematic in FIG. 7 to which it corresponds. As seen in FIG. 11, the connection ports are made long in the direction orthogonal to the preferred M4 routing to accomplish the goal of maximizing the number of tracks on M4 that can access a particular port. In the specific embodiment, since horizontal is the preferred direction for M4 traces, the connection ports are made long in the vertical direction. In other embodiments, the connection ports may be longer in the horizontal direction, allowing vertical traces on other metal layers to connect on many tracks. Alternatively, some embodiments may even use diagonal routing for some or all of the connection ports to allow easy connections in either direction.

Though the specific embodiment provides connection ports on the M3 layer, this is not necessarily the case. Connection ports may desirably be on a higher metal layer such as M4 in a six metal layer design. Alternatively, the connection ports may be provided on a via layer such as the via layer connecting M3 and M4.

In some cases, not all of the transistors in a particular asynchronous cell 700 are used in a particular design. Thus, it may be desirable to turn a transistor off by connecting its gate electrode to VDD or VSS. To facilitate this or other desirable connections to these power sources, the specific embodiment also provides VDD and VSS ports on the M3 layer as shown in FIG. 11. These are preferably placed as close to the gate electrodes of those transistors in asynchronous cell 700 that are most often turned off.

Figure 12B:
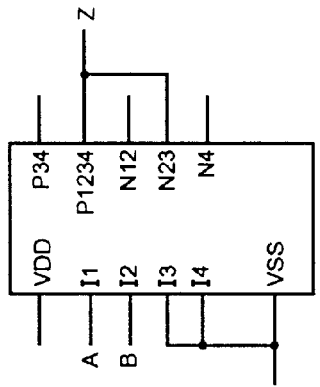
FIGS. 12A and B illustrate the use of the circuit in FIG. 7 as a 2-input NAND gate.
Figure 12A:
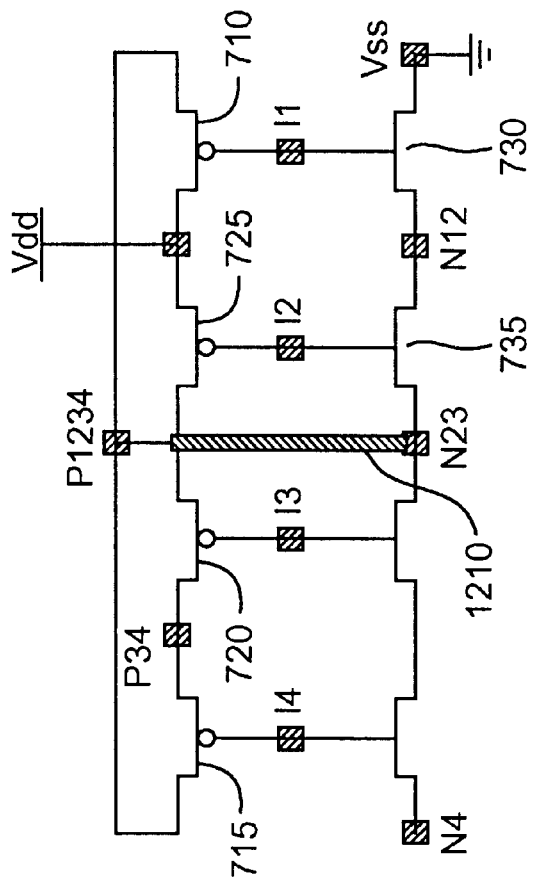

FIGS. 12A and 12B illustrate how the circuit in FIG. 7 may be used to create particular logic functions—in this case a 2-input NAND gate. A trace 1210 connects P1234 with N23. Assuming connection port I1 is a first input and connection port I2 is a second input, one of skill in the art will recognize that this provides a 2-input NAND gate with first and fourth p-type transistors 710 and 725 in parallel and fifth and sixth n-type transistors 730 and 735 in series between VDD and VSS. If both inputs are high, the output is pulled to the VSS potential, and if either or both inputs are low, the output is pulled to the VDD potential. The transistors 715, 720, 740, and 745 are not utilized in this specific embodiment of the 2-input NAND gate and as such ports I3 and I4 may be optionally connected to VDD or VSS.

Figure 13:
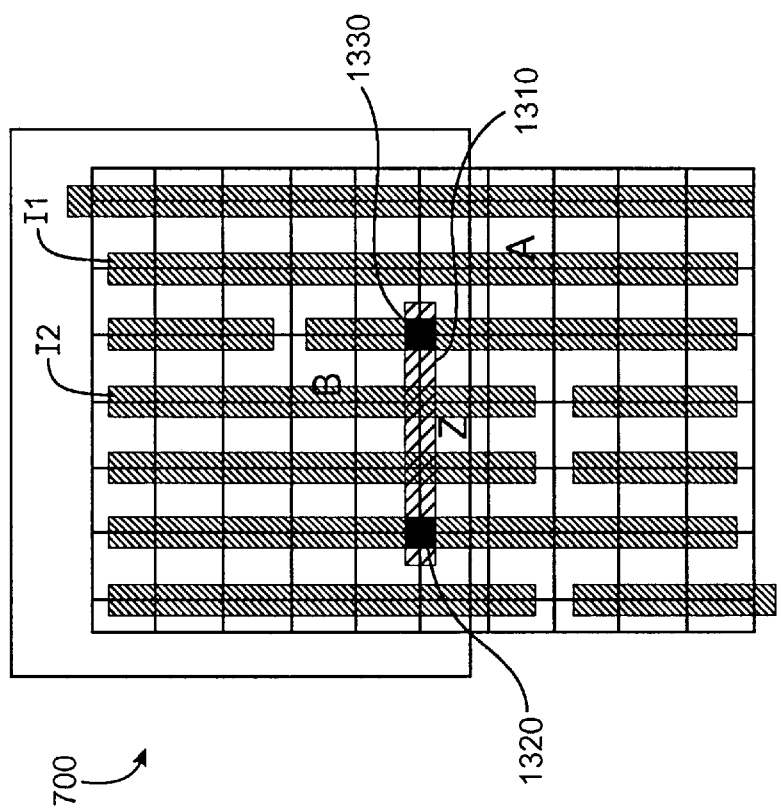
FIG. 13 shows how a custom 2-input NAND gate may be formed using the core cell of FIG. 7.

FIG. 13 shows how asynchronous core cell 700 may be used by a designer in accordance with one aspect of the present invention to implement the circuit shown in FIG. 12A by customizing only the fourth metal layer (M4). A trace 1310 is placed across connection ports P1234 and N23 on the M4 layer and contacted to each port with contact 1320 and contact 1330, respectively. Since, according to another aspect of the invention, these connection ports are made long in the vertical direction, these connection ports may be connected as shown in FIG. 13 with a single, short, strait trace 1310 thereby minimizing the number of tracks on the M4 layer that are blocked by this customization. Input signals on the M4 or other layers may be connected to input A at connection port I1 and input B at connection port I2. Similarly, the output signal may be taken from output Z along trace 1310. It will be readily apparent that such a design requires very little metal and real estate to be used to create a 2-input NAND gate. This is facilitated by the long connection ports and by placing in close proximity those connection ports that are frequently connected in close proximity to one another.

Figure 14:
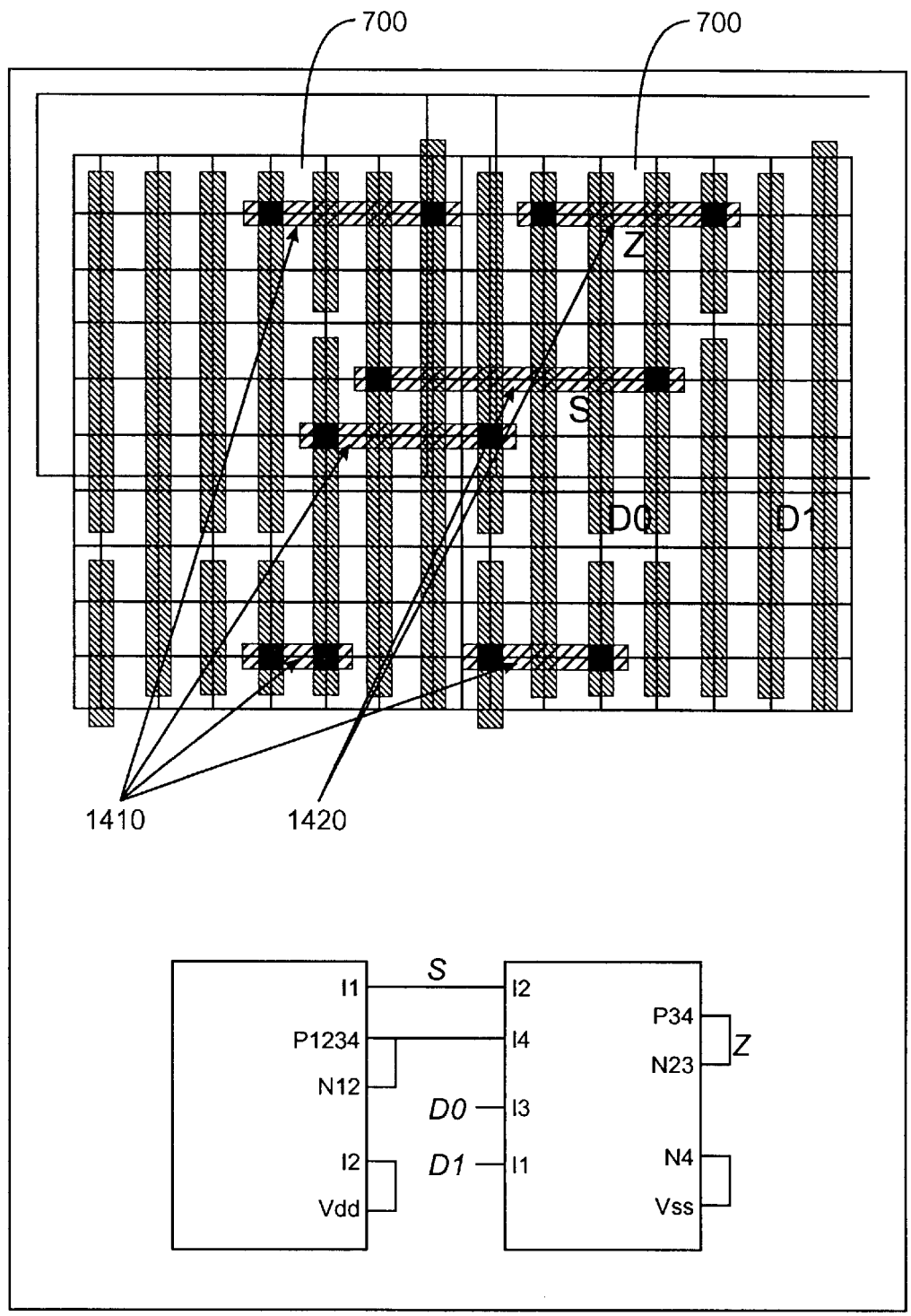
FIG. 14 shows how a 2:1 multiplexor may be formed using the core cell of FIG. 7.

More complex logic functions may also be achieved by combining two or more predesigned asynchronous core cells 700. Similarly, M5 and higher levels may be used also to create more complex logic function. Routing resources may be greatly reduced by using adjacent predesigned asynchronous core cells 700 for these complex logic functions. FIG. 14 shows a customization pattern using the M4 layer to implement a 2:1 multiplexor using two adjacent asynchronous core cells 700. As is well known in the art, a 2:1 multiplexor provides either the signal on input D0 or the signal on input D1 to the output Z depending on the value of the signal on input S. Various transistor level interconnections 1410 and 1420 are made on the M4 layer. Two predesigned asynchronous core cells 700, 16 transistors and six M4 interconnections are used to implement this multiplexor. Of course, other configurations of a multiplexor are also possible.

Figure 15:
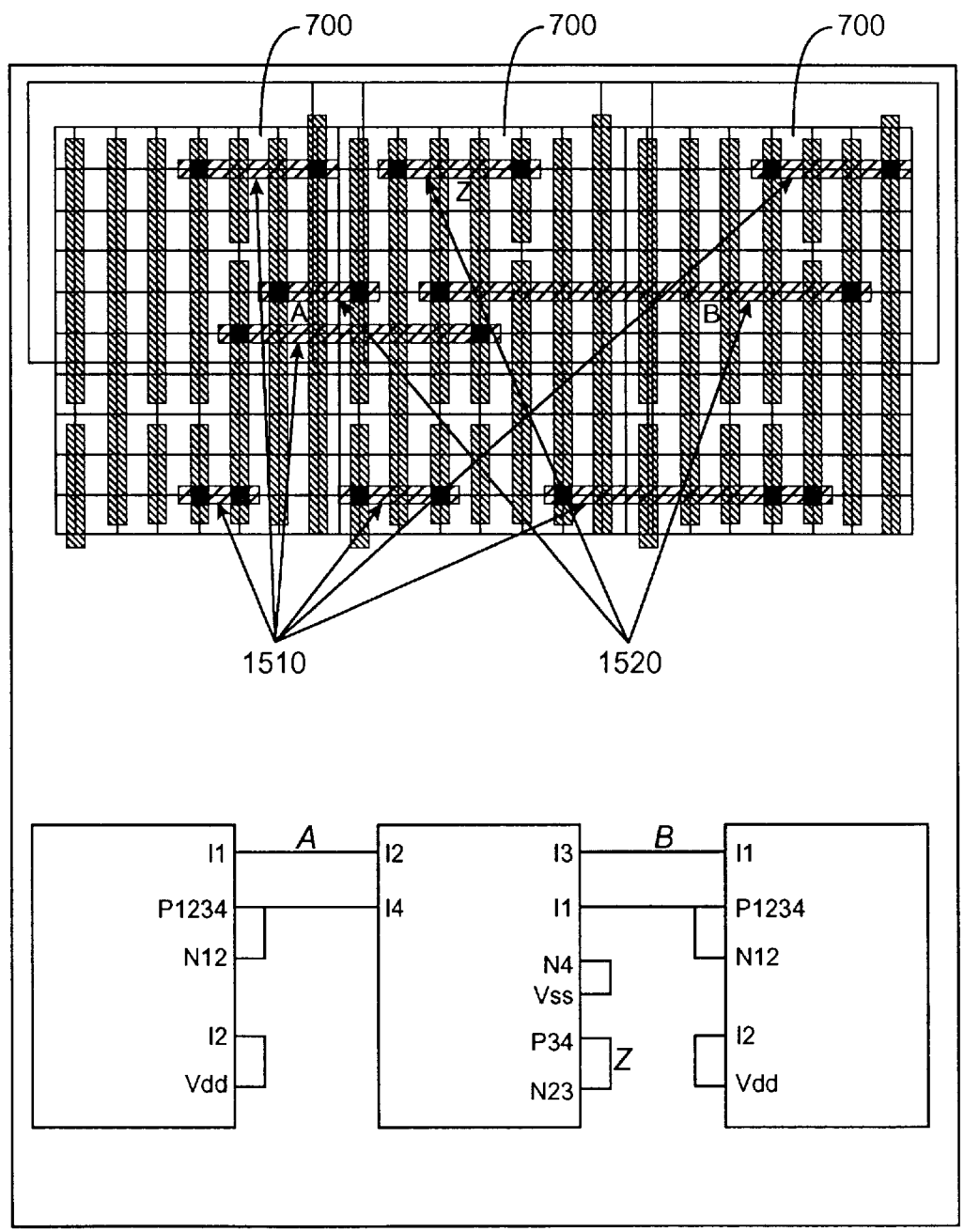
FIG. 15 shows how a 2-input exclusive-OR (EX-NOR) function may be formed using the core cell of FIG. 7.

Similarly, FIG. 15 shows a customization design for a 2-input Exclusive-NOR function using the M4 layer to provide the customization. In this example, the two inputs are input A and input B. Output Z provides the result of the Exclusive-NOR function. Nine M4 segments 1510 and 1520 are used across three predesigned asynchronous core cells 700 to provide the functionality. The nine segments 1510 and 1520 are advantageously placed such that only four horizontal tracks are blocked by the customization, leaving the remaining six M4 tracks free for global or other routing between the logic blocks.

An advantage of the architecture of the present invention is the improvement in the manufacturing time for integrated circuits using its principles. The integrated circuit may be prefabricated through the first three metal layers to be available for customization on demand using only the M4 layer and higher as soon as a design is ready. Thus, in a five metal layer design, only the M4 and M5 layers are customized for a particular design.

A design and fabrication methodology for designing integrated circuits using the architecture described herein is as follows. A generic predesigned integrated IC is fabricated with the above-described architecture up through the M3 layer. This may be done prior to design completion or even before design work has even begun. The designer then customizes the design by providing mask sets for the M4 and M5 layers (or any other higher layers, etc.) A mask set comprises the metal layer mask and its associated via layer mask. Of course, via levels such as those connecting M3 to M4, M4 to M5, etc. are also customized for each design to provide connections to the higher levels of metal. Thus, in a five-metal-layer design (i.e. five mask sets) only two mask sets are needed to complete the fully personalized design.

Another significant benefit from the new architecture is evident in the placement and routing of large, complex design netlists. Typically a large design netlist may contain several hundred thousand to a million placement objects. Each such object can be classified as a synchronous or asynchronous cell. Automatic placement of such a large number of cells is a very difficult and time-consuming task. So, it is desirable to partition the large design into small partitions that can be placed and routed much more quickly. However, the current partitioning methods are not efficient at this task. A novel method for partitioning a large design is derived from the new architecture.

According to this new method, the large design netlist is first reduced into a smaller synchronous netlist containing only the synchronous elements from the original netlist. This may be done by several techniques, for example, by designating cells as being either synchronous or asynchronous depending on whether they have a clock signal or not. Some critical cells such as internal bus drivers may be included in the reduced netlist. Next, the connectivity between the synchronous cells in the reduced netlist is derived from the original netlist by one of several different techniques. In one approach the timing relationship between the synchronous cells in the original design is used to derive interconnections between the asynchronous cells, and assign the importance of the connection. The importance is determined by the timing—i.e., the more critical the timing, the more important the connection. In another approach all the asynchronous cells between the synchronous cells are replaced by a simple short-circuit between the inputs and output.

Typically the reduced synchronous netlist will contain 20 to 30 times fewer cells than the original design. Accordingly, placing and routing the synchronous netlist on the chip separately is much easier and less time consuming. In the present invention, the integrated circuit chip upon which the design netlist is to be placed has two exclusive, distributed regions for the placement of synchronous and asynchronous netlists. According to an aspect of the present invention, the smaller synchronous netlist is placed in the synchronous region of the chip, as a good representation of the full design. The asynchronous regions on the chip are initially not used, saved for later placement of the asynchronous parts of the design.

Once the placement of the synchronous netlist is determined, the original large design can be partitioned in to smaller physical blocks on the integrated circuit. For example, the integrated circuit area is divided in to an 8×8 array of 64 smaller partitions. Each partition starts with the synchronous cells that are already placed within its boundaries. Next, the remaining asynchronous cells from the original large design are assigned to the partitions on the basis of their proximity to the synchronous cells that already belong to a specific partition. The proximity being derived from logical, timing or netlist relationships between the synchronous and asynchronous cells. In some cases there is no clear measure as to which of two or more partitions a cell belongs. In such cases an arbitrary decision can be made. This process is repeated until all the asynchronous cells are assigned to the partitions. As the cells are assigned to different partitions, the signals that cross partition boundaries are marked as inter-block routes, and pins are assigned to each block. Such inter-block pins may be driven by high-drive buffers placed under global power stripes.

Once the large design is partitioned into smaller blocks, we can achieve very significant improvements in the speed and efficiency of placing and routing of large designs. In one specific embodiment the individual partitions are placed and routed first and then the inter-block nets are routed using metal resources reserved for global nets. In another embodiment the inter-block nets are routed first, and the individual partitions are routed later.

Specific embodiments of the architecture are presented herein, but it will be readily recognized that improvements may be realized over the existing art by implementation of the embodiments exactly as described or by implementing some subset or combination of the described embodiments. The specific embodiments are given by way of example only and are not intended to be limiting. The present invention is intended to be limited only by the attached claims.

What is claimed is:

1. A semiconductor integrated circuit device useful for forming customized circuits comprising:
   a semiconductor substrate;
   a plurality of predesigned core cells based on the semiconductor substrate, each predesigned core cell comprising:
   a plurality of transistors;
   a first metal layer being the first metal layer adjacent the semiconductor substrate and separated by a first insulating layer;
   a second metal layer adjacent the first metal layer and separated by a second insulating layer; and
   a third metal layer adjacent the second metal layer and separated by a third insulating layer; and
   a plurality of upper metal layers above the third metal layer and separated by at least a fourth insulating layer,
   wherein at least one of the first metal layer, the second metal layer and the third metal layer provides electrical coupling among the transistors to define functionality of the predesigned core cells and wherein at least one of the first metal layer, the second metal layer and the third metal layer provides electrical coupling between the transistors and a power source to provide supply current to the predesigned core cells, such that the semiconductor integrated circuit can be filly customized by use of only the upper metal layers above the third metal layer.

2. The semiconductor integrated circuit of claim 1 further comprising a first type of core cell in a first region and a second type of core cell in a second region, the first type of core cell being connected to a dedicated clock trace and the second type of core cell being not coupled to the dedicated clock trace.

3. The semiconductor integrated circuit of claim 1 wherein a clock trace for the core cells are located on at least one of the first metal layer, the second metal layer and the third metal layer.

4. The semiconductor integrated circuit device of claim 1 further comprising one of the group comprising a reset trace, a scan trace, a scan enable trace and a clock trace are located on at least one of the first metal layer, the second metal layer and the third metal layer.

5. The semiconductor integrated circuit device of claim 1 wherein the predesigned core cells include four p-type transistors and four n-type transistors.

6. The semiconductor integrated circuit device of claim 5 wherein the four p-type transistors are coupled in series and the four n-type transistors are coupled in series and a gate of each of the four p-type transistors is coupled to a gate of one of the n-type transistors.

7. The semiconductor integrated circuit of claim 1 wherein each of the plurality of transistors comprises a gate, the gate longer in a first direction than a second direction, the semiconductor integrated circuit further comprising:
    a fourth metal layer adjacent the third metal layer and separated by a fourth insulating layer,
    wherein the fourth metal layer is formed into traces, the traces longer in the second direction than the first direction.

8. The semiconductor integrated circuit of claim 7 further comprising:
    a fifth metal layer adjacent the fourth metal layer and separated by a fifth insulating layer,
    wherein the fifth metal layer is formed into traces, the traces longer in the first direction than the second direction.

9. The semiconductor integrated circuit of claim 1 wherein the plurality of predesigned core cells each have a length in a first direction and a length in a second direction, the semiconductor integrated circuit further comprising:
    a first plurality of traces formed from at least one of the first, second, or third metal layers, the first plurality of traces substantially as long as the length of the predesigned core cell in the first direction.

10. The semiconductor integrated circuit of claim 9 further comprising:
    a fourth metal layer adjacent the third metal layer and separated by a fourth insulating layer; and
    a second plurality of traces formed from the fourth layer of metal,
    wherein the first plurality of traces may connect to the second plurality of traces.

11. The semiconductor integrated circuit of claim 10 further comprising:
    a buffer coupled between a first trace of the first plurality of traces and a second trace of the first plurality of traces.

12. The semiconductor integrated circuit of claim 10 wherein the first plurality of traces comprises a clock trace.

13. The semiconductor integrated circuit of claim 10 wherein the first plurality of traces comprises a clock trace and two shield traces, the clock trace between the two shield traces.

14. The semiconductor integrated circuit of claim 10 wherein the first plurality of traces comprises a power supply trace.

15. The semiconductor integrated circuit of claim 1 wherein each of the plurality of transistors comprises a gate, the gate longer in a first direction than a second direction, and the third metal layer is formed into traces, the traces longer in the fit direction than the, second direction, and comprising a first power supply trace for carrying a first power supply voltage.

16. The semiconductor integrated circuit of claim 15 wherein the traces further comprise:
    a second power supply trace for carrying a second power supply; and
    a third power supply trace for carrying the second power supply.

17. The semiconductor integrated circuit of claim 16 wherein the first power supply trace is between the second power supply trace and the third power supply trace.

18. The semiconductor integrated circuit of claim 1 wherein a first transistor in the plurality of transistors is coupled to a second transistor in the plurality of transistors though traces, the traces formed from at least one of the first, second, or third metal layers.

19. The semiconductor integrated circuit of claim 18 wherein a first transistor in the plurality of transistors is coupled to a power supply though a trace, the trace formed from at least one of the first, second, or third metal layers.

20. An integrated circuit useful for forming customized circuits comprising:
    a semiconductor substrate;
    a plurality of predesigned core cells based on the semiconductor substrate, each predesigned core cell including a plurality of transistors;
    a plurality of lower level metal layers comprising:
        a first lower metal layer being the fist metal layer above the semiconductor substrate and separated by at least a first insulating layer;
        a second lower metal layer above the first lower metal layer and separated by at least a second insulating layer; and
        a third lower metal layer above the second lower metal layer and separated by at least a third insulating layer; and
    a plurality of upper level metal layers above the lower metal layers and separated by at least a fourth insating layer,
    wherein at least one of the first, second, or third lower metal layers provide electrical coupling among the transistors to define functionality of the predesigned core cells, and
    wherein at least one of the first second, or third lower metal layers provide electrical coupling between tile transistors and a power source to provide supply current to the predesigned core cells, such that the semiconductor integrated circuit can be customized using the plurality of upper level metal layers.

21. The integrated circuit of claim 20 wherein the second lower metal layer is adjacent to the first lower metal layer and the third lower metal layer is adjacent to the second lower metal layer.

22. The integrated circuit of claim 21 wherein the plurality of upper metal layers comprises:
    a first upper level metal layer above the third lower metal layer and separated by at least the fourth insulating layer; and
    a second upper metal layer above the first upper metal layer and separated by at least a fifth insulating layer.

23. The integrated circuit of claim 20 wherein each of the plurality of transistors comprises a gate, the gate longer in a first direction than a second direction, and the plurality of upper metal layers comprises:
    a first upper metal layer being the first metal layer above the plurality of lower metal layers, and separated from them by at least a fourth insulating layer,
    wherein the first upper metal layer is formed into a first plurality of traces, the first plurality of traces longer in the second direction than the first direction.

24. The integrated circuit of claim 23 wherein the plurality of upper metal layers further comprises:
a second upper metal layer above the first upper metal layer and separated by at least a fifth insulating layer, wherein the second upper metal layer is formed into a second plurality of traces, the second plurality of traces longer in the first direction than the second direction.

25. The integrated circuit of claim 20 wherein the plurality of predesigned core cells each have a length in a first direction and a length in a second direction, the integrated circuit further comprising:
a first plurality of traces formed from at least one of the first, second, or third lower metal layers, the first plurality of traces substantially as long as the length of the predesigned core cell in the first direction.

26. The integrated circuit of claim 25 further comprising:
a first upper metal layer being the first metal layer above the plurality of lower metal layers, and separated from them by at least a fourth insulating layer; and
a second plurality of traces formed from the first upper layer of metal,
wherein the first plurality of traces may connect to the second plurality of traces.

27. The integrated circuit of claim 26 further comprising:
a buffer coupled between a first trace of the first plurality of traces and a second trace of the first plurality of traces.

28. The integrated circuit of claim 26 wherein the first plurality of traces comprises a clock trace.

29. The integrated circuit of claim 26 wherein the first plurality of traces comprises a clock trace and two shield traces, the clock trace between the two shield traces.

30. The integrated circuit of claim 26 wherein the first plurality of traces comprises a power supply trace.

31. The integrated circuit of claim 20 wherein each of the plurality of transistors comprises a gate, the gate longer in a first direction than a second direction, and the third lower metal layer is formed into traces, the traces longer in the first direction than the second direction, and comprising a first power supply trace for carrying a first power supply voltage.

32. The integrated circuit of claim 31 wherein the traces further comprise:
a second power supply trace for carrying a second power supply; and
a third power supply trace for carrying the second power supply.

33. The semiconductor integrated circuit of claim 32 wherein the first power supply trace is between the second power supply trace and the third power supply trace.

34. The semiconductor integrated circuit of claim 20 wherein a first transistor in the plurality of transistors is coupled to a second transistor in the plurality of transistors though traces, the traces formed from at least one of the first, second, or third lower metal layers.

35. The semiconductor integrated circuit of claim 34 wherein a first transistor in the plurality of transistors is coupled to a power supply though a trace, the trace formed from at least one of the first, second, or third lower metal layers.

36. An integrated circuit comprising:
a semiconductor substrate;
a plurality of core cells formed on the semiconductor substrate, each core cell comprising a plurality of transistors;
a plurality of lower level metal layers above the substrate; and
a plurality of upper level metal layers above the lower meal layers and separated from the lower metal layers by at least a first insulating layer,
wherein the plurality of lower metal layers couple the plurality of transistors in at least one of the plurality of core cells together to form a first circuit comprising a plurality of nodes, and
wherein the plurality of upper level metal layers couple at least two of the plurality of nodes in the first circuit together to form a second circuit.

37. The integrated circuit of claim 36 wherein the first circuit is not a combinational circuit, and the second circuit is a combinational circuit.

38. The integrated circuit of claim 36 wherein only some of the plurality of nodes of the first circuit may directly connect to the upper level metal layers.

39. The integrated circuit of claim 36 wherein the first circuit comprises:
a first plurality of transistors of a first type coupled in series, a source of a first transistor in the series being coupled to the drain of a last transistor in the series; and
a second plurality of transistors of a second type coupled in series, wherein a gate of each of the first plurality of transistors is coupled to a gate of a transistor in the second plurality of transistors.

40. The integrated circuit of claim 36 wherein the plurality of lower level metals comprise:
a first lower metal layer being the first metal layer above the semiconductor substrate and separated by at least a second insulating layer;
a second lower metal layer above the first lower metal layer and separated by at least a third insulating layer; and
a third lower metal layer above the second lower metal layer and separated by at least a fourth insulating layer.

41. The semiconductor integrated circuit of claim 40 wherein each of the plurality of transistors comprises a gate, the gate longer in a first direction than a second direction, and the upper level metal layers further comprise:
a fourth metal layer adjacent the third metal layer and separated by a fifth insulating layer,
wherein the fourth metal layer is formed into traces, the traces longer in the second direction than the first direction.

42. The semiconductor integrated circuit of claim 41 wherein the upper level metal layers further comprise:
a fifth metal layer adjacent the fourth metal layer and separated by a sixth insulating layer,
wherein the fifth metal layer is formed into traces, the traces longer in the first direction than the second direction.

43. The semiconductor integrated circuit of claim 36 wherein each of the plurality of transistors comprises a gate, the gate longer in a first direction than a second direction, and the lower level metal layers comprise a third metal layer formed into traces, the traces longer in the first direction tan the second direction and comprising a first power supply trace for carrying a first power supply voltage.

44. An integrated circuit comprising:
a semiconductor substrate;
a plurality of core cells formed on the semiconductor substrate, each core cell comprising a plurality of transistors;
a plurality of lower level metal layers above the substrate; and a plurality of upper level metal layers above the lower metal layers and separated from the lower metal layers by at least a first insulating layer, wherein the plurality of lower metal layers couple the plurality of transistors in at least one of the plurality of core cell together to form a first circuit comprising a plurality of nodes, and further couple the first circuit to a power supply conductor to provide power supply current during operation of the integrated circuit, and wherein the plurality of upper level metal layers couple at least two of the plurality of nodes in the first circuit together to form a second circuit.

45. The integrated circuit of claim 44 wherein the first circuit is not a combinational circuit, and the second circuit is a combinational circuit.

46. The integrated circuit of claim 44 wherein the plurality of lower level metals comprise:

a first lower metal layer being the first metal layer above the semiconductor substrate and separated by at least a second insulating layer;

a second lower metal layer above the fist lower metal layer and separated by at least a third insulating layer; and a third lower metal layer above the second lower metal layer and separated by at least a fourth insulating layer.

47. An integrated circuit comprising:

a semiconductor substrate;

a first cell formed in the semiconductor substrate and comprising a plurality of active devices;

a plurality of lower level metal layers above the substrate forming a first plurality of traces, wherein the first plurality of traces couples the plurality of active devices to form a first configuration comprising a plurality of nodes; and a plurality of upper level metal layers above plurality of lower level metals forming a second plurality of traces, wherein a first trace of the second plurality of traces couples at least two of the first plurality of traces together, such that the first trace of the second plurality of traces and the first plurality of traces couple the plurality of active devices to form a second configuration, and wherein a second trace of the second plurality of traces couples the first cell to a second cell.

48. The integrated circuit of claim 47 wherein the first configuration is not a combinational circuit, and the second configuration is a combinational circuit.

49. The integrated circuit of claim 47 wherein only some of the plurality of nodes of the first circuit may directly connect to the second plurality of traces.

50. The integrated circuit of claim 47 wherein the plurality of lower level metals comprise:

a first lower metal layer being the first metal layer above the semiconductor substrate and separated by at least a fist insulating layer;

a second lower metal layer above the fist lower metal layer and separated by at least a second insulating layer; and a third lower metal layer above the second lower metal layer and separated by at least a third insulating layer.

51. The semiconductor integrated circuit of claim 50 wherein each of the plurality of transistors comprises a gate, the gate longer in a first direction than a second direction, and the upper level metal layers further comprise:

a fourth metal layer adjacent the third metal layer and separated by a fourth insulating layer, wherein the fourth metal layer is formed into a third plurality of traces, the third plurality of traces longer in the second direction than the first direction.

52. The semiconductor integrated circuit of claim 51 wherein the upper level metal layers further comprise:

a fifth metal layer adjacent the fourth metal layer and separated by a fifth insulating layer, wherein the fifth metal layer is formed into a fourth plurality of aces, the fourth plurality of traces longer in the first direction than the second direction.

53. The semiconductor integrated circuit of claim 47 wherein each of the plurality of transistors comprises a gate, the gate longer in a first direction than a second direction, and the lower level metal layers comprise a third metal layer formed into a third plurality of traces, the third plurality of traces longer in the first direction than the second direction, and comprising a first power supply trace for carrying a first power supply voltage.

* * * * *